United States Patent
Lee

(10) Patent No.: US 9,929,170 B2
(45) Date of Patent: Mar. 27, 2018

(54) SEMICONDUCTOR DEVICE

(71) Applicant: SK hynix Inc., Icheon-si Gyeonggi-do (KR)

(72) Inventor: Hyun Ho Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 25 days.

(21) Appl. No.: 15/218,203

(22) Filed: Jul. 25, 2016

(65) Prior Publication Data
US 2017/0271353 A1    Sep. 21, 2017

(30) Foreign Application Priority Data

Mar. 15, 2016 (KR) .................. 10-2016-0030813

(51) Int. Cl.
| | | |
|---|---|---|
| *H01L 29/792* | (2006.01) | |
| *H01L 27/11582* | (2017.01) | |
| *H01L 27/1157* | (2017.01) | |
| *H01L 23/522* | (2006.01) | |
| *H01L 23/528* | (2006.01) | |

(52) U.S. Cl.
CPC ...... *H01L 27/11582* (2013.01); *H01L 23/528* (2013.01); *H01L 23/5226* (2013.01); *H01L 27/1157* (2013.01)

(58) Field of Classification Search
CPC ....... H01L 23/52; H01L 27/115; H01L 29/792
USPC .................................. 257/320–326
See application file for complete search history.

(56) References Cited

U.S. PATENT DOCUMENTS

2013/0270568 A1* 10/2013 Rabkin ............... H01L 29/6675
                                                                   257/66

FOREIGN PATENT DOCUMENTS

KR        1020140086670 A      7/2014

* cited by examiner

*Primary Examiner* — Marvin Payen
(74) *Attorney, Agent, or Firm* — William Park & Associates Ltd.

(57) ABSTRACT

Provided herein is a semiconductor device. The semiconductor device may include a substrate, conductive patterns, and a pipe gate. The substrate may have first and second regions arranged in a first direction and a third region arranged between the first and second regions. The conductive patterns may be stacked on the substrate to be spaced apart from each other, and may extend from the first region to the second region. The pipe gate may be arranged between the conductive patterns and the substrate to overlap the first region. The pipe gate may not be overlapped with the third region.

17 Claims, 18 Drawing Sheets

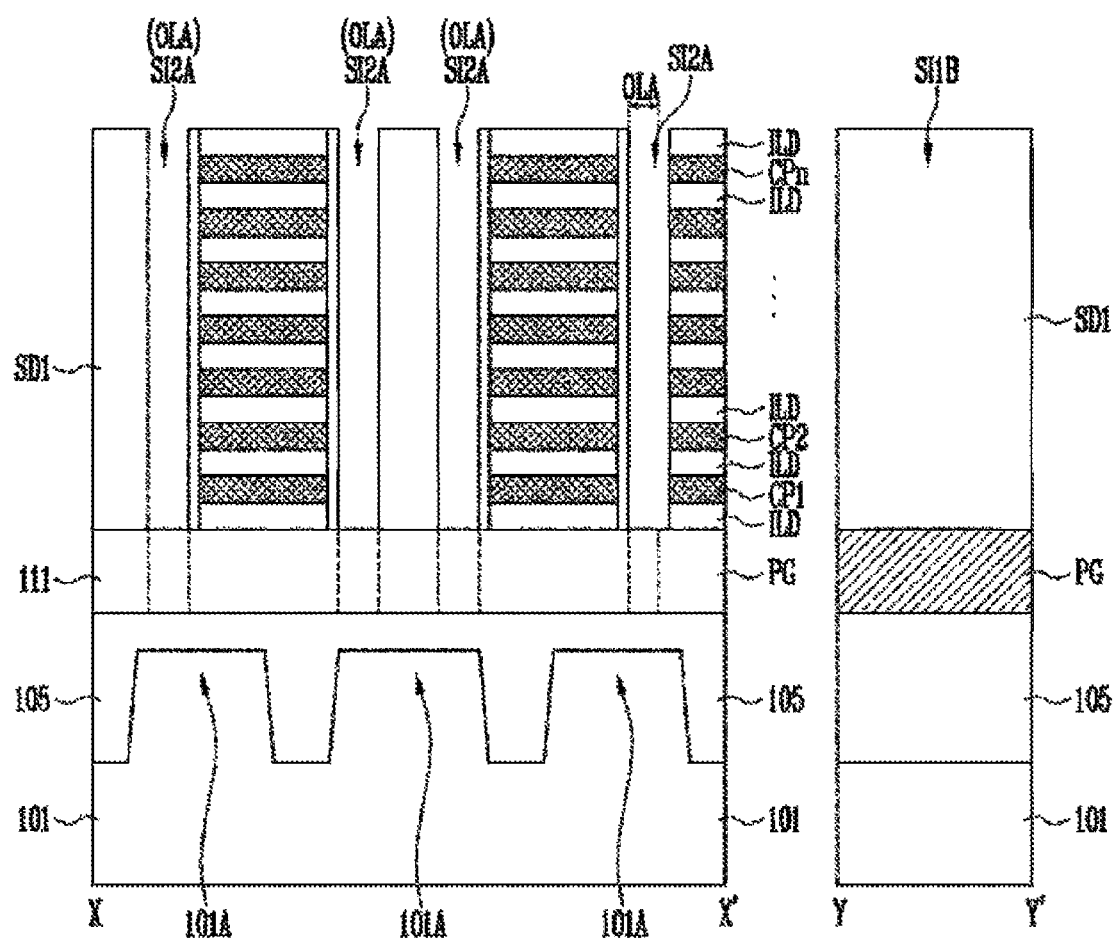

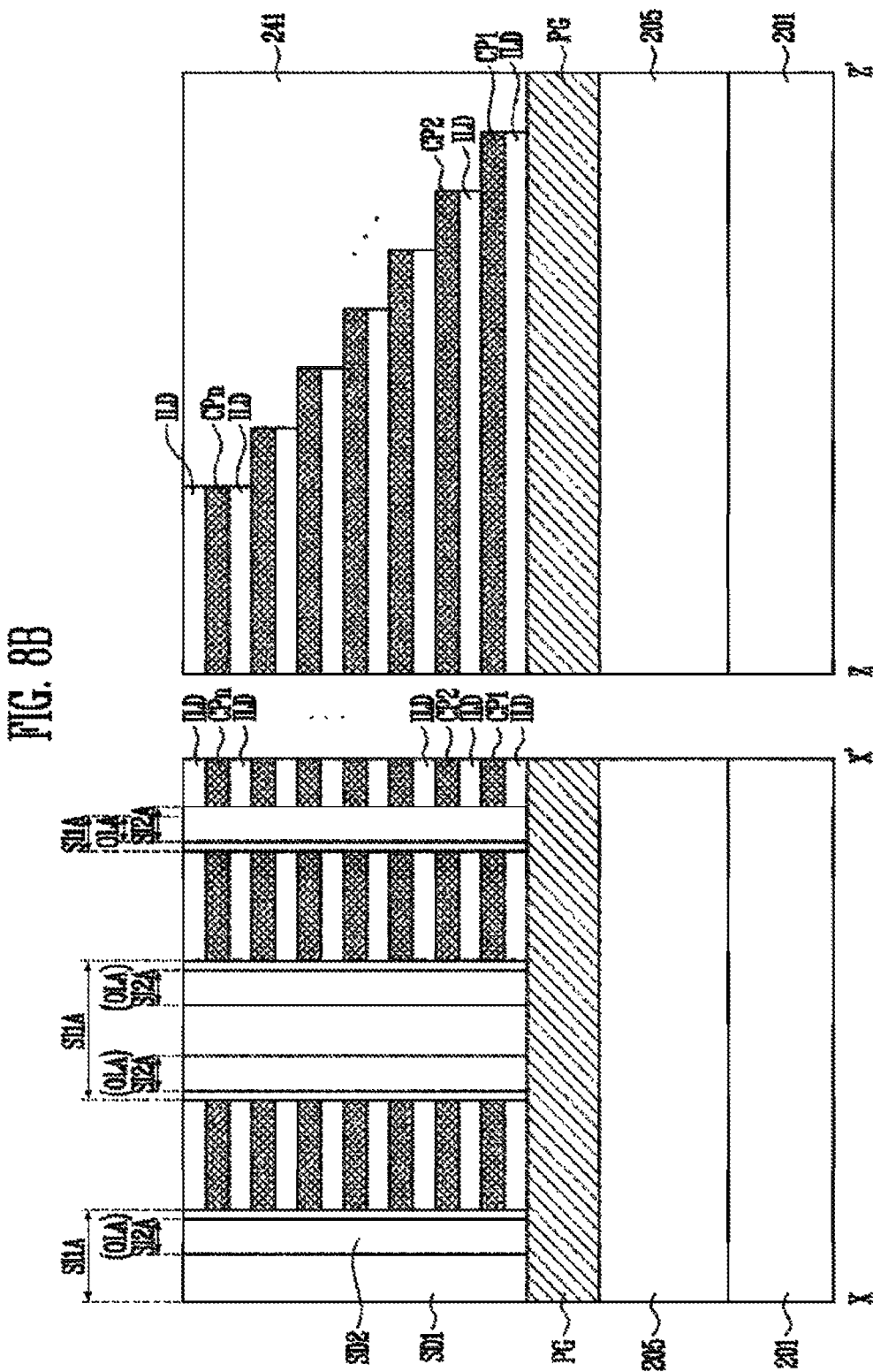

SEMICONDUCTOR DEVICE

CROSS-REFERENCE TO RELATED APPLICATION

The present application claims priority under 35 U.S.C. § 119(a) to Korean patent application number 10-2016-0030813 filed on Mar. 15, 2016, the entire disclosure of which is incorporated herein by reference.

BACKGROUND

1. Technical Field

Various embodiments of the present disclosure generally relate to a semiconductor device, and more particularly to a semiconductor device including a stack structure of conductive patterns.

2. Related Art

A memory device having memory cells capable of storing data is one of the examples of semiconductor devices. As miniaturization of devices proceeds, designs for the memory device follow in the same pattern. The desire to improve integration density leads to the development of three-dimensional semiconductor products. For example, the memory cells may be vertically arranged. The memory cells arranged in the three-dimensional cell array may be coupled to various conductive patterns that are disposed at different heights, and the conductive patterns may be penetrated by slits.

The slits may define a layout of the conductive patterns. Some of the slits may overlap each other. The slits may be formed by etching a stack structure having a plurality of layers stacked on top of one another. A region where the slits overlap each other may be subjected to etching processes twice. Thus, the layers placed in the region where the slits overlap each other may be excessively etched. In this case, in the region where the slits overlap each other, some of the slits may extend to an active region of a substrate or may be placed near the active region of the substrate.

In a process of manufacturing the semiconductor device, a conductive material may remain in bottoms of the slits. If the conductive material remains in some slits that are deeply formed due to the excessive etching, the remaining conductive materials may cause a bridge failure, which means that the active region may be electrically connected to a gate pattern on the active region. The bridge failure leads to the malfunction of the semiconductor device.

SUMMARY

In an embodiment of the present disclosure, a semiconductor device may include a substrate, conductive patterns, and a pipe gate. The substrate may include first and second regions arranged in a first direction, and a third region arranged between the first and second regions. The conductive patterns may be stacked on the substrate to be spaced apart from each other, and may extend from the first region to the second region. The pipe gate may be arranged between the conductive patterns and the substrate to overlap the first region. The pipe gate may not be overlapped with the third region.

In an embodiment of the present disclosure, a semiconductor device may include a substrate, conductive patterns, a first slit, a second slit, and a trench. The substrate may include first and second regions arranged in a first direction, and a third region arranged between the first and second regions. The conductive patterns may be stacked on the substrate to be spaced apart from each other, and may extend from the first region to the second region. The first and second slits may pass through the conductive patterns, and may intersect with each other in the third region. The trench may be placed in the substrate to delimit the active regions, and may extend along the third region to overlap an intersecting portion of the first slit and the second slit.

BRIEF DESCRIPTION OF THE DRAWINGS

FIGS. 7A to 7F are sectional views illustrating an example method of manufacturing the semiconductor device illustrated in FIGS. 3A to 4B.

FIGS. 8A to 8C are sectional views illustrating an example method of manufacturing the semiconductor device illustrated in FIGS. 5A to 6B.

DETAILED DESCRIPTION

Figure 1:
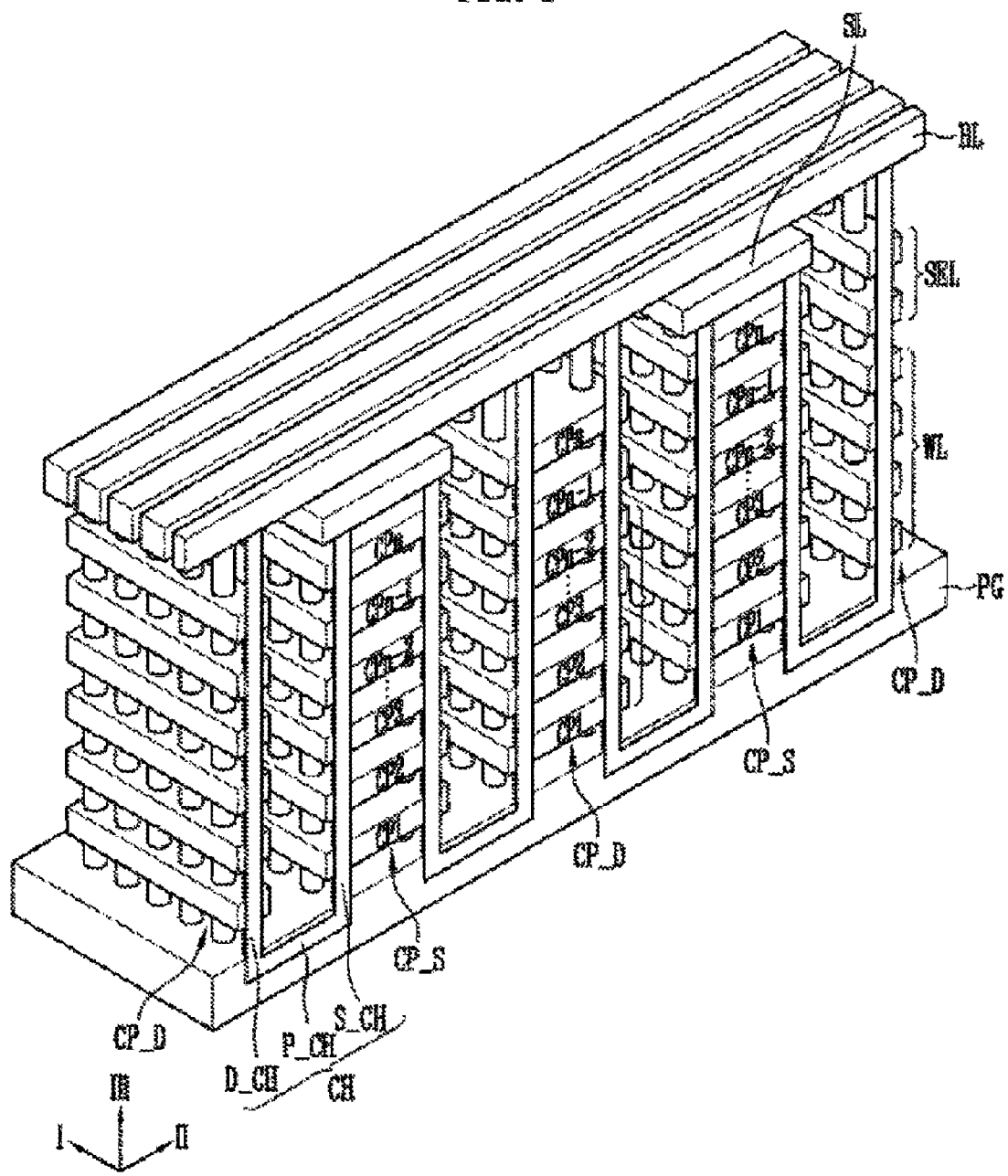
FIG. 1 is a perspective view illustrating an example of a memory cell string structure of a semiconductor device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

Some embodiments of the present disclosure provide a semiconductor device capable of preventing the malfunction of a semiconductor device due to a bridge failure.

FIG. 1 is a perspective view illustrating an example of a memory cell string structure of a semiconductor device according to an embodiment of the present disclosure. FIG. 1 shows a structure that is placed in a first region of the semiconductor device according to an embodiment of the present disclosure.

Referring to FIG. 1, the memory cell string according to an embodiment of the present disclosure may be formed in a three-dimensional structure along a channel layer CH. The memory cell string may include memory cells and select transistors that are stacked along the channel layer CH. Gates of the memory cells and gates of the select transistors may be coupled to conductive patterns CP1 to CPn, respectively.

The channel layer CH may include a pipe channel layer P_CH embedded in a pipe gate PG, a source-side channel pillar S_CH extending from the pipe channel layer P_CH, and a drain-side channel pillar D_CH extending from the pipe channel layer P_CH. The source-side channel pillar S_CH and the drain-side channel pillar D_CH may be coupled to each other by the pipe channel layer P_CH. The channel layer CH may be formed in an embedded type. Alternatively, the channel layer CH may be formed in a tube type. The embedded-type channel layer CH may be formed along a central region of a channel hole that defines the shape of the channel layer. For example, the embedded-type channel layer CH completely fills the central region of the channel hole that defines the shape of the channel layer. The tube-type channel layer CH may be formed such that a conductive material surrounds a core insulating layer that fills the central region of the channel hole. The channel hole and the channel layer CH may be formed in various shapes, such as a 'U' shape or a 'W' shape. Although FIG. 1 illustrates a pair of source-side channel pillar S_CH and drain-side channel pillar D_CH as being coupled to the pipe channel layer P_CH, the present disclosure is not limited thereto. For example, three or more channel pillars may be coupled to the pipe channel layer P_CH.

The channel layer CH may be electrically coupled between a source line SL and a bit line BL. The bit line BL and the source line CSL may be placed in different layers to be spaced apart from each other. For example, the source line SL may be placed under the bit line BL. The source line SL may be electrically coupled to an upper end of the source-side channel pillar S_CH. The source line SL may extend in a first direction I. A source contact plug may be formed between the source line SL and the source-side channel pillar S_CH. The bit line BL may be electrically coupled to an upper end of the drain-side channel pillar D_CH. The bit line BL may extend in a second direction II intersecting with the first direction I. A drain contact plug may be formed between the bit line BL and the drain-side channel pillar D_CH.

The conductive patterns CP1 to CPn may be arranged in a plurality of layers that are placed under the bit line BL and the source line SL and spaced apart from each other. The conductive patterns CP1 to CPn may include word lines WL and select lines SEL. The select lines SEL may be placed on the word lines WL. The select lines SEL may be formed in at least one layer of conductive patterns. If the number of the conductive patterns CP1 to CPn is 'n' as illustrated in FIG. 1, the select lines SEL may be composed of two layers (e.g., $n^{th}$ and $(n-1)^{th}$ conductive patterns CPn and CPn-1), but the present disclosure is not limited thereto. For example, the select lines SEL may be composed of only one layer (e.g., the $n^{th}$ conductive pattern CPn). Alternatively, the select lines SEL may be composed of three or more layers. For example, the select lines SEL may be composed of the $n^{th}$ conductive pattern CPn and two or more other conductive patterns (e.g., CPn-1 and CPn-2) placed under the $n^{th}$ conductive pattern CPn.

The conductive patterns CP1 to CPn may be separated by slits to be separated into source-side conductive patterns CP_S and drain-side conductive patterns CP_D. A specific layout of the slits will be described later with reference to FIG. 2.

The word lines WL included in the source-side conductive patterns CP_S may be used as source-side word lines, while the select lines SEL included in the source-side conductive patterns CP_S may be used as source select lines. The word lines WL included in the drain-side conductive patterns CP_D may be used as drain-side word lines, while the select lines SEL included in the drain-side conductive patterns CP_D may be used as drain select lines. The source-side conductive patterns CP_S may surround the source-side channel pillar S_CH, while the drain-side conductive patterns CP_D may surround the drain-side channel pillar D_CH.

The pipe gate PG may be placed under the conductive patterns CP1 to CPn, and may surround the pipe channel layer P_CH.

Although not illustrated, an outer wall of the channel layer CH may be surrounded with multi layers including a tunnel insulating layer, a data storing layer and a blocking insulating layer. The tunnel insulating layer may surround the outer wall of the channel layer, and may be formed to conform to the shape of the outer wall of the channel layer. The data storing layer may surround the outer wall of the tunnel insulating layer, and may be formed to conform to the shape of the outer wall of the tunnel insulating layer. The blocking insulating layer may surround the outer wall of the data storing layer, and may be formed to conform to the shape of the outer wall of the data storing layer. Alternatively, the multi layers may be formed along a sidewall of each of the conductive patterns CP1 to CPn that are in contact with the channel layer CH, and may extend along upper and lower surfaces of each of the conductive patterns CP1 to CPn. In this case, the multi layers may be separated by the slit to have a C-shaped cross-section.

According to the above-described structure, the source-side memory cells are formed on intersecting portions of the source-side channel pillar S_CH and the word lines WL of the source-side conductive patterns CP_S, while the drain-side memory cells are formed on intersecting portions of the drain-side channel pillar D_CH and the word lines WL of the drain-side conductive patterns CP_D. The source select transistors are formed on intersecting portions of the source-side channel pillar S_CH and the select lines SEL of the source-side conductive patterns CP_S, while the drain select transistors are formed on intersecting portions of the drain-side channel pillar D_CH and the select lines SEL of the drain-side conductive patterns CP_D. The pipe transistor is formed on an intersecting portion of the pipe channel layer P_CH and the pipe gate PG. The source select transistor, the source-side memory cells, the pipe transistor, the drain-side memory cells, and the drain select transistor arranged along one channel layer CH may be coupled in series through the channel layer CH. The source select transistor, the source-side memory cells, the pipe transistor, the drain-side memory cells, and the drain select transistor, which are coupled in series, may form a memory cell string, and the shape of the memory cell string may vary depending on the shape of the channel layer CH. The conductive patterns CP1 to CPn may be used to carry electrical signals to gates of the memory cells, and gates of the source select transistor and the drain select transistor. The pipe transistor may couple the source-side memory cells to the drain-side memory cells in response to a signal applied to the pipe gate PG.

Figure 2:
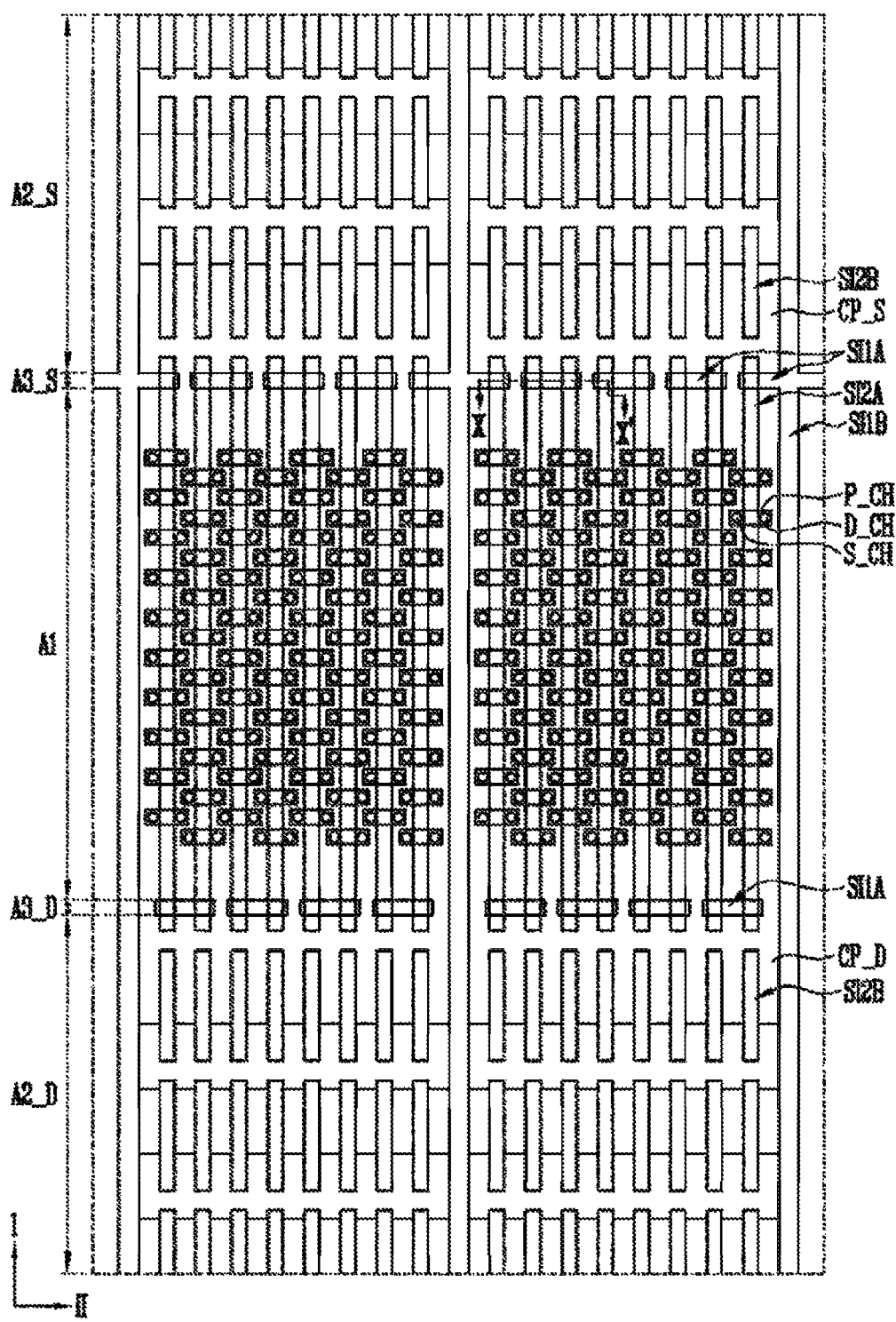
FIG. 2 is a plan view illustrating examples of first to third regions of the semiconductor device according to an embodiment of the present disclosure.

FIG. 2 is a plan view illustrating examples of first to third regions of the semiconductor device according to an embodiment of the present disclosure.

Referring to FIG. 2, the semiconductor device may include a substrate having a first region A1, second regions A2_S and A2_D, and third regions A3_S and A3_D. The first region A1, second regions A2_S and A2_D, and third regions A3_S and A3_D may be arranged in the first direction I. The memory cell string illustrated in FIG. 1 may be placed in the first region A1. That is, the first region A may be defined as a cell region including the memory cells that are arranged in three dimensions. For example, the source-side conductive patterns CP_S and the drain-side conductive patterns CP_D coupled to the memory cell string may be placed on the first region A1 of the substrate. The source-side conductive patterns CP_S are penetrated by the source-side channel pillar S_CH, while the drain-side conductive patterns CP_D are penetrated by the drain-side channel pillar D_CH. The source-side channel pillar S_CH and the drain-side channel pillar D_CH may extend from the pipe channel layer P_CH. A plurality of pipe channel layers P_CH may be placed on the first region A1 in the form of a matrix. In order to enhance a memory cell density per unit area, the pipe channel layers P_CH may be arranged in a zigzag fashion in the first direction I and the second direction II intersecting with the first direction I.

The second regions A2_S and A2_D may include a source-side second region A2_S and a drain-side second region A2_D. The first region A1 may be placed between the source-side second region A2_S and the drain-side second region A2_D. The source-side conductive patterns CP_S may extend from the first region A1 to the source-side second region A2_S. The drain-side conductive patterns CP_D may extend from the first region A1 to an upper portion of the drain-side second region A2_D. The source-side conductive patterns CP_S and the drain-side conductive patterns CP_D may include pad patterns that form stepped structures on the source-side second region A2_S and the drain-side second region A2_D, respectively.

The third regions A3_S and A3_D may be placed between the first region A1 and the second regions A2_S and A2_D. For example, the third regions A3_S and A3_D may include a source-side third region A3_S and a drain-side third region A3_D. The source-side third region A3_S may be placed between the first region A1 and the source-side second region A2_S. The drain-side third region A3_D may be placed between the first region A1 and the drain-side second region A2_D.

The source-side conductive patterns CP_S may extend from the first region A1 through the source-side third region A3_S to the source-side second region A2_S. The drain-side conductive patterns CP_D may extend from the first region A1 through the drain-side third region A3_D to the drain-side second region A2_D.

Pattern layouts of the source-side conductive patterns CP_S and the drain-side conductive patterns CP_D may be defined by slits SI1A, SI1B, SI2A and SI2B. The slits SI1A, SI1B, SI2A and SI2B may be divided into first slits SI1A and SI1B and second slits SI2A and SI2B according to a processing group. For example, the first slits SI1A and SI1B may be simultaneously formed using a first etching process, while the second slits SI2A and SI2B may be simultaneously formed using a second etching process. The first slits SI1A and SI1B may be filled with first slit insulating layers, while the second slits SI2A and SI2B may be filled with second slit insulating layers.

The first slits SI1A and SI1B may include a first-type first slits SI1A and a second-type first slit SI1B. The first-type first slits SI1A and the second-type first slit SI1B may extend in different directions intersecting with each other.

The first-type first slits SI1A may be placed on the third regions A3_S and A3_D, respectively. The first-type first slits SI1A may extend in the second direction II. The first-type first slits SI1A may be placed on the third regions A3_S and A3_D, respectively, and may be spaced apart from each other in the second direction II. The first-type first slits SI1A placed on the source-side third region A3_S and the first-type first slits SI1A placed on the drain-side third region A3_D may be arranged in a zigzag fashion.

The second-type first slit SI1B may extend in the first direction I. For example, the second-type first slit SI1B may extend from the first region A1 to the second regions A2_S and A2_D. The second-type first slit SI1B may separate the source-side conductive patterns CP_S and the drain-side conductive patterns CP_D of a memory block from those of another memory block. The second-type first slit SI1B may be coupled to one of the first-type first slits SI1A arranged on one of the source-side third region A3_S and the drain-side third region A3_D, and may be spaced apart from the first-type first slits SI1A on the other region. For example, the second-type first slit SI1B may be coupled to one of the first-type first slits SI1A on the source-side third region A3_S, and may be spaced apart from the first-type first slits SI1A on the drain-side third region A3_D.

The second slits SI2A and SI2B may include a first-type second slits SI2A and a second-type second slits SI2B. The first-type second slits SI2A and the second-type second slits S21B may be used as an etching-material introduction path for removing a sacrificial material or a conductive-material introduction path for forming conductive patterns.

The first-type second slits SI2A may extend from the first region A1 to the third regions A3_S and A3_D. Both ends of each first-type second slit SI2A may extend to edges of the second regions A2_S and A2_D, respectively, that are adjacent to the third regions A3_S and A3_D. The first-type second slits SI2A may intersect with the first-type first slits SI1A on the third regions A3_S and A3_D. The first-type second slits SI2A may separate each of the source-side conductive patterns CP_S and the drain-side conductive patterns CP_D into line patterns on the first region A1.

The second-type second slits SI2B may be placed on the second regions A2_S and A2_D. The second-type second slits SI2B may be spaced apart from each other.

According to a structure where the aforementioned first-type first slits SI1A and first-type second slits SI2A are arranged, the conductive patterns may be separated into the source-side conductive patterns CP_S and the drain-side conductive patterns CP_D by the first-type first slits SI1A and the first-type second slits SI2A. The first-type first slits SI1A and the first-type second slits SI2A intersect with each other on the third regions A3_S and A3_D. Thus, some of material layers placed on the third regions A3_S and A3_D may be excessively etched by the first etching process for forming the first slits SI1A and SI1B and the second etching process for forming the second slits SI2A and SI2B. Embodiments of the present disclosure may modify the layout of the pipe gate or the layout of the active regions so as to prevent a bridge failure of the active regions or the pipe gate of the semiconductor device corresponding to the third regions A3_S and A3_D. Hereinafter, various embodiments of the present disclosure will be described in more detail.

Figure 3A:
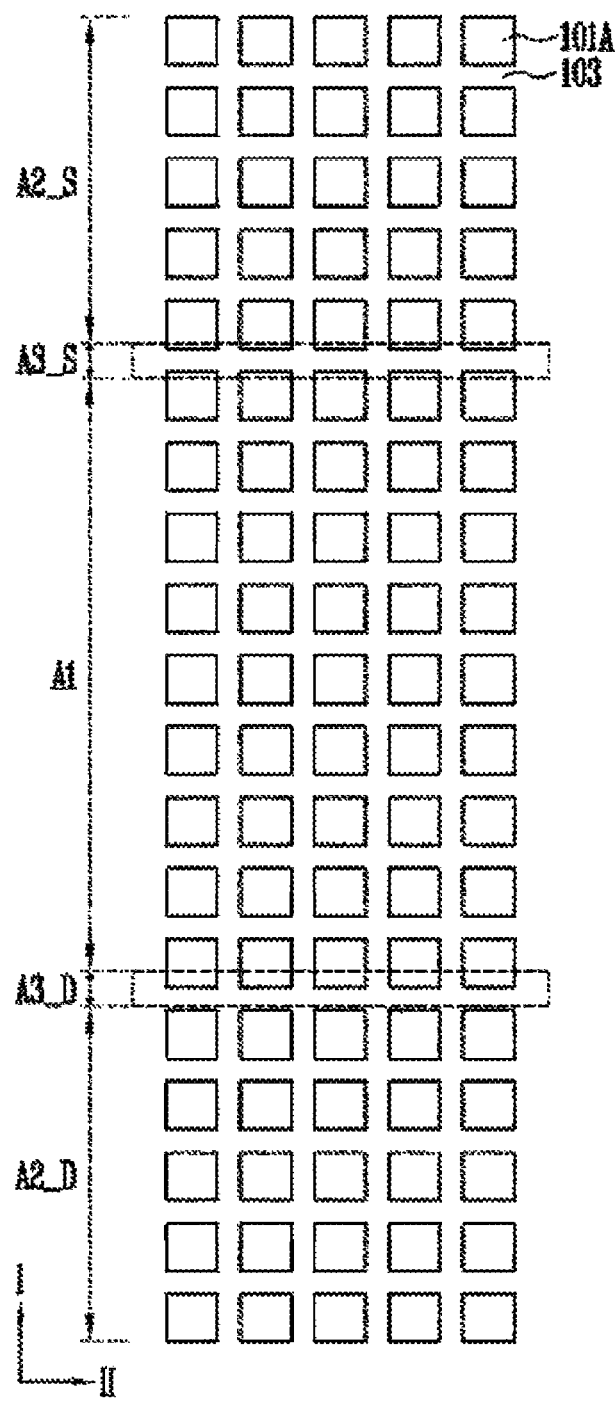
FIGS. 3A and 3B are plan views illustrating an example layout of active regions, a pipe gate, and conductive patterns of a semiconductor device according to an embodiment of the present disclosure.
Figure 3B:
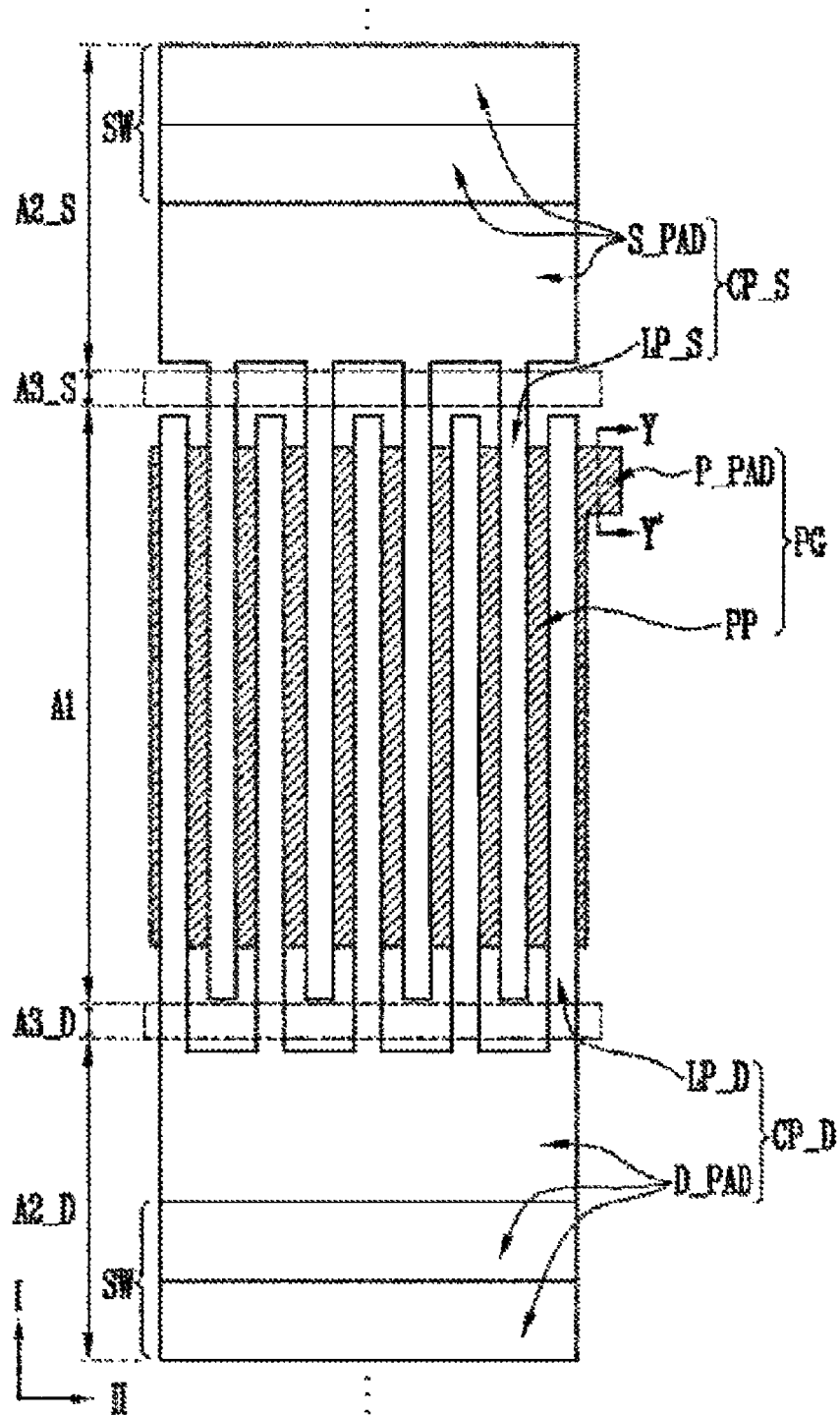

FIGS. 3A and 3B are plan views illustrating an example layout of the active regions, the pipe gate, and the conductive patterns of the semiconductor device according to an embodiment of the present disclosure.

FIG. 3A is a plan view illustrating an example layout of the active regions of the substrate.

Referring to FIG. 3A, the substrate may include active regions 101A delimited by a trench 103. The trench 103 may be formed in the substrate to a predetermined depth. The trench 103 may be formed in a mesh type. The active regions 101A may be arranged in a uniform density in the substrate including the first region A1, the second regions A2_S and A2_D, and the third regions A3_S and A3_D. The third regions A3_S and A3_D may or may not include the active regions 101A.

The substrate including the trench 103 and the active regions 101A illustrated in FIG. 3A may be placed under the structure illustrated in FIG. 2. The substrate including the trench 103 and the active regions 101A illustrated in FIG. 3A may be placed under the structure illustrated in FIG. 1.

FIG. 3B is a plan view illustrating an example layout of the pipe gate and the conductive patterns placed on the substrate including the active regions illustrated in FIG. 3A. FIG. 3B illustrates an overlapping relation between the pipe gate and the conductive patterns adopting the conductive patterns of FIG. 2 by way of example.

Referring to FIG. 3B, the pipe gate PG may be placed under the source-side conductive patterns CP_S and the drain-side conductive patterns CP_D to overlap the first region A1 of the substrate. The pipe gate PG may be formed not to overlap the third regions A3_S and A3_D. The pipe gate PG may be formed not to overlap the second regions A2_S and A2_D. The pipe gate PG may be formed not to exceed the first region A1.

When the pipe gate PG does not overlap the third regions A3_S and A3_D, the pipe gate PG may not overlap the intersecting portion of the first-type first slit (SI1A of FIG. 2) and the first-type second slit (SI2A of FIG. 2) placed on the third regions A3_S and A3_D. Thus, an embodiment of the present disclosure may avoid a bridge failure that otherwise would have been caused by a possible bridge formation between the pipe gate PG and the active regions (101A of FIG. 3A) placed under the pipe gate PG at the intersecting portion of the first-type first slit (SI1A of FIG. 2) and the first-type second slit (SI2A of FIG. 2).

The pipe gate PG may include a plate pattern PP, and a pipe pad pattern P_PAD laterally extending from the plate pattern PP. The plate pattern PP may be formed in a region where the pipe channel (P_CH of FIGS. 1 and 2) is placed, and the pipe pad pattern P_PAD may protrude laterally such that it does not overlap the source-side conductive patterns CP_S and the drain-side conductive patterns CP_D.

The source-side conductive patterns CP_S may be stacked on the substrate, and may be spaced apart from each other. The source-side conductive patterns CP_S may include source-side line patterns LP_S and source-side pad patterns S_PAD. The source-side conductive patterns CP_S may extend from the first region A1 of the substrate towards the source-side second region A2_S of the substrate. For example, the source-side line patterns LP_S may extend from the first region A1 of the substrate through the source-side third region A3_S of the substrate towards the source-side second region A2_S of the substrate. The source-side pad patterns S_PAD may be stacked on the source-side second region A2_S to form a stepped structure SW. The source-side pad patterns S_PAD may extend from the source-side line patterns LP_S. The source-side line patterns placed on the same layer may be coupled in common to the source-side pad pattern placed on the same layer as the source-side line patterns. The source-side pad patterns S_PAD may not overlap the pipe gate PG.

The drain-side conductive patterns CP_D may be stacked on the substrate, and may be spaced apart from each other. The drain-side conductive patterns CP_D may include drain-side line patterns LP_D and drain-side pad patterns D_PAD. The drain-side conductive patterns CP_D may extend from the first region A1 of the substrate towards the drain-side second region A2_D of the substrate. For example, the drain-side line patterns LP_D may extend from the first region A1 of the substrate through the drain-side third region A3_D of the substrate towards the drain-side second region A2_D of the substrate. The drain-side pad patterns D_PAD may be stacked on the drain-side second region A2_D to form the stepped structure SW. The drain-side pad patterns D_PAD may extend from the drain-side line patterns LP_D. The drain-side line patterns placed on the same layer may be coupled in common to the drain-side pad pattern placed on the same layer as the drain-side line patterns. The drain-side pad patterns D_PAD may not overlap the pipe gate PG.

Each of the source-side pad patterns S_PAD and the drain-side pad patterns D_PAD may form the stepped structure SW in the first direction I. The stepped structure SW may define a region with which gate contact plugs (not illustrated) are to come into contact.

The pipe pad pattern P_PAD may protrude from the plate pattern PP in the second direction II. The pipe pad pattern P_PAD may be used as a region with which a pipe contact plug is to come into contact.

Figure 4A:
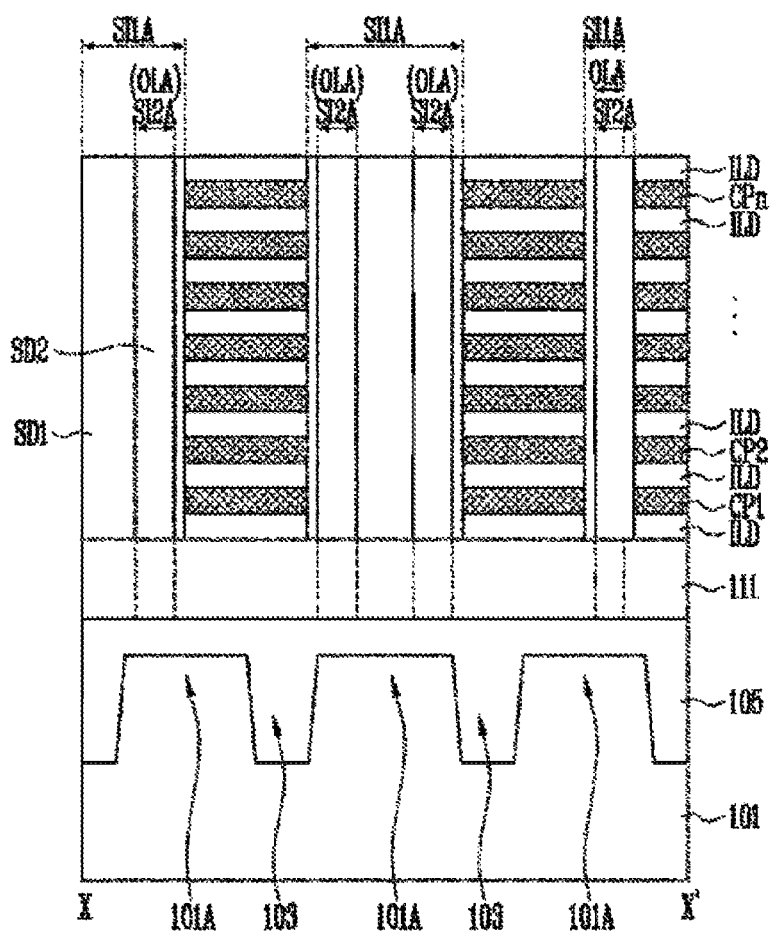
FIGS. 4A and 4B are sectional views illustrating an example of a semiconductor device according to an embodiment of the present disclosure.
Figure 4B:
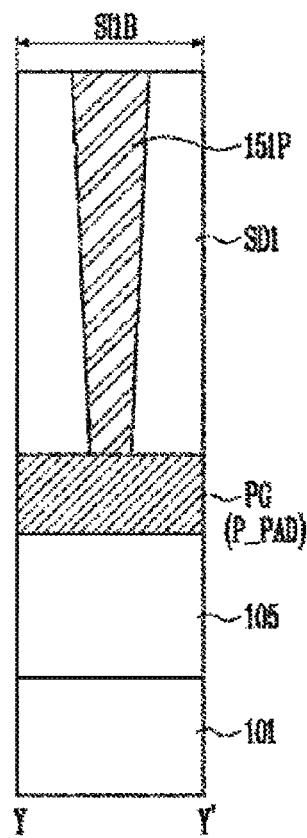

FIGS. 4A and 4B are sectional views illustrating an example of the semiconductor device according to an embodiment of the present disclosure. To be more specific, FIG. 4A is a sectional view taken along line X-X' of FIG. 2, and FIG. 4B is a sectional view taken along line Y-Y' of FIG. 3B.

Referring to FIGS. 4A and 4B, the substrate 101 may include active regions 101A delimited by a trench 103. The trench 103 may be filled with an isolation layer 105. The isolation layer 105 may be formed in a mesh type in the same manner as the trench 103 to delimit the active regions 101A. A portion of the isolation layer 105 may be formed to cover the active regions 101A.

The pipe gate PG may be formed on the substrate 101 including the isolation layer 105 and the active regions 101A. A pipe-gate insulating layer 111 may be formed on the same layer as the pipe gate PG. That is, the pipe gate PG and the pipe-gate insulating layer 111 may be provided between the substrate 101 and a stack structure of the conductive patterns CP1 to CPn. The pipe-gate insulating layer 111 may pass through the pipe gate PG and define the plane shape of the pipe gate PG.

Interlayer insulation patterns ILD and conductive patterns CP1 to CPn may be alternately stacked on the pipe gate PG and the pipe-gate insulating layer 111. The interlayer insulation patterns ILD and the conductive patterns CP1 to CPn may be penetrated by first and second slits SI1A, SI1B and SI2A. The first and second slits SI1A, SI1B and SI2A may be filled with first and second slit insulating layers SD1 and SD2, respectively.

The first-type first slits SI1A may intersect with the first-type second slits SI2A. Hereinafter, regions where the first-type first slits SI1A overlap the first-type second slits SI2A may be defined as overlapping regions OLA. At the overlapping regions OLA, the second slit insulating layers SD2 may pass through the first slit insulating layers SD1.

As indicated by broken lines in FIG. 4A, some of the first-type second slits SI2A may pass through pipe-gate insulating layer 111 due to the excessive etching at the overlapping regions OLA. According to an embodiment of the present disclosure, the pipe gate PG is not placed under the overlapping regions OLA, thus preventing the first-type second slits SI2A from passing through the pipe gate PG at the overlapping regions OLA. Therefore, even if a conductive material remains in bottoms of the first-type second slits SI2A at the overlapping region OLA, a probability of a bridge failure that the remaining conductive material connects the active region 101A to the pipe gate PG may decrease.

In FIG. 4B, the second-type first slit SI1B may overlap the pipe pad pattern P_PAD of the pipe gate PG. The first slit insulating layer SD1 filling the interior of the second-type first slit SI1B may be penetrated by the pipe contact plug 151P. The pipe contact plug 151P may extend to come into contact with the pipe pad pattern P_PAD. The pipe contact plug 151P and the pipe pad pattern P_PAD may overlap the isolation layer 105 that is thick and fills the interior of the trench. In other words, the pipe contact plug 151P and the pipe pad pattern P_PAD may not overlap the active region 101A of the substrate. In this case, even if the pipe contact plug 151P is deeply formed in the process of forming the pipe contact plug 151P, a probability of a bridge failure may decrease by preventing the pipe contact plug 151P from being connected to the active region 101A.

Figure 5A:
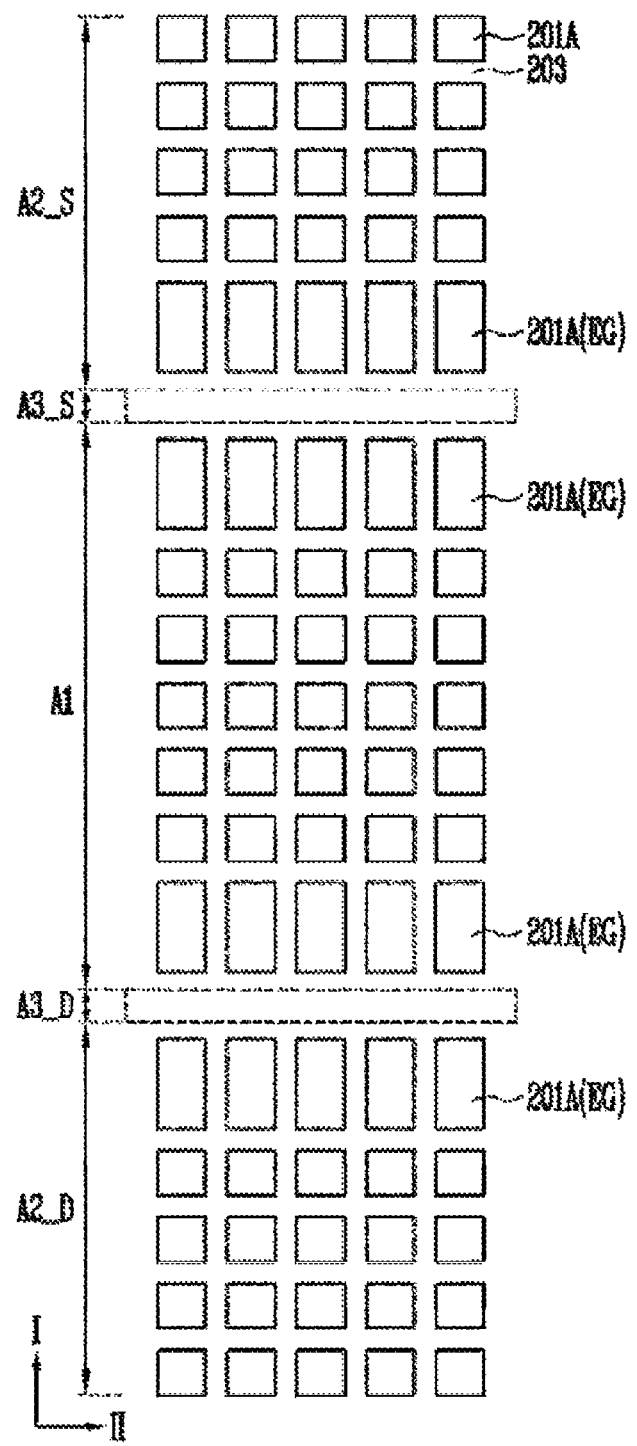
FIGS. 5A and 5B are plan views illustrating an example layout of active regions, a pipe gate, and conductive patterns of a semiconductor device according to an embodiment of the present disclosure.
Figure 5B:
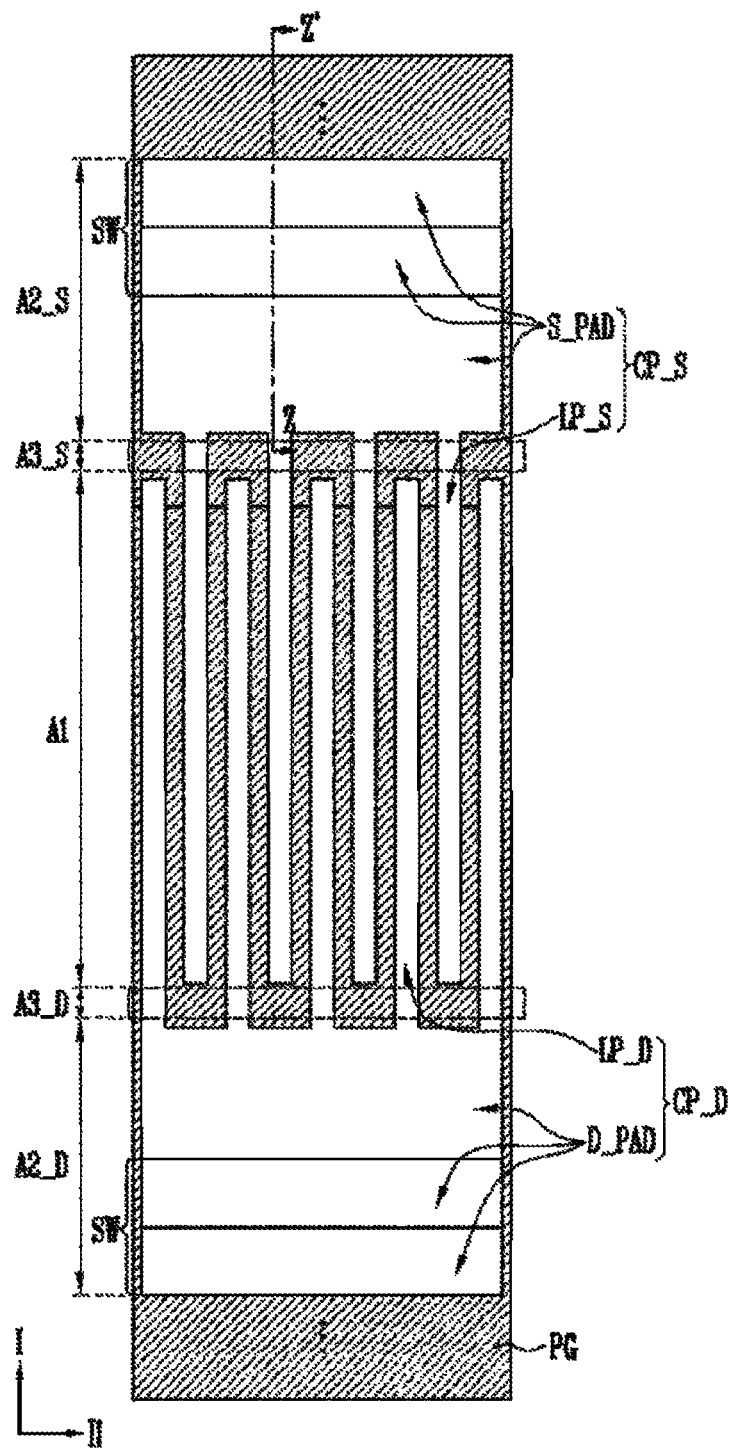

FIGS. 5A and 5B are plan views illustrating an example layout of active regions, a pipe gate, and conductive patterns of the semiconductor device according to an embodiment of the present disclosure.

FIG. 5A is a plan view illustrating an example layout of the active regions of the substrate.

Referring to FIG. 5A, the substrate may include the active regions 201A delimited by a trench 203. The trench 203 may be formed in the substrate to a predetermined depth. The trench 203 may be formed in a mesh type. The active regions 201A may be placed on a first region A1 and second regions A2_S and A2_D, respectively. The active regions 201A may not be formed on third regions A3_S and A3_D. Edge regions EG close to the third regions A3_S and A3_D in the active regions 201A may be patterned to have an area wider than the remaining regions. Thus, a pattern density of the active regions 201A per unit area may become uniform as they become distant from the third regions A3_S and A3_D. Embodiments of the present disclosure are not limited thereto. For example, although not illustrated, the active regions 201A may be patterned to have the same plane area in each of the first region A1 and the second regions A2_S and A2_D.

The trench 203 may be placed along the third regions A3_S and A3_D. The third regions A3_S and A3_D may include an isolation layer that is thick and fills the trench 20. Thus, the active regions 201A may not overlap the intersecting portion of the first-type first slit (SI1A of FIG. 2) and the first-type second slit (SI2A of FIG. 2) that are placed on the third regions A3_S and A3_D. An embodiment of the present disclosure may avoid a bridge failure that otherwise would have been caused by a possible bridge formation between the active regions 201A and the pipe gate (PG of FIG. 5b) at the intersecting portion of the first-type first slit (SI1A of FIG. 2) and the first-type second slit (SI2A of FIG. 2).

The substrate including the trench 203 and the active regions 201A illustrated in FIG. 5A may be placed under the structure of FIG. 2. The substrate including the trench 203 and the active regions 201A illustrated in FIG. 5A may be placed under the structure of FIG. 1.

FIG. 5B is a plan view illustrating an example layout of the pipe gate and the conductive patterns placed on the substrate including the active regions illustrated in FIG. 5A. FIG. 5B illustrates an overlapping relation between the pipe gate and the conductive patterns adopting the conductive patterns of FIG. 2 by way of example.

Referring to FIG. 5B, the pipe gate PG may be placed under the source-side conductive patterns CP_S and the drain-side conductive patterns CP_D to overlap the first region A1 of the substrate. The pipe gate PG may extend from the first region A1 through the third regions A3_S and A3_D to the second regions A2_S and A2_D. The pipe gate PG may extend to protrude further than the source-side conductive patterns CP_S and the drain-side conductive patterns CP_D.

The source-side conductive patterns CP_S may include source-side line patterns LP_S and source-side pad patterns S_PAD forming a stepped structure SW as illustrated in FIG. 3B. The drain-side conductive patterns CP_D may include drain-side line patterns LP_D and drain-side pad patterns D_PAD forming a stepped structure SW as illustrated in FIG. 3B.

The source-side pad patterns S_PAD and the drain-side pad patterns D_PAD may overlap the pipe gate PG. The source-side pad patterns S_PAD and the drain-side pad patterns D_PAD may be formed in the stepped structures SW, respectively, to expose the ends of the pipe gate PG. The ends of the pipe gate PG may protrude further laterally than the source-side pad patterns S_PAD and the drain-side pad patterns D_PAD to define a region with which the pipe contact plug is to come into contact.

Figure 6A:
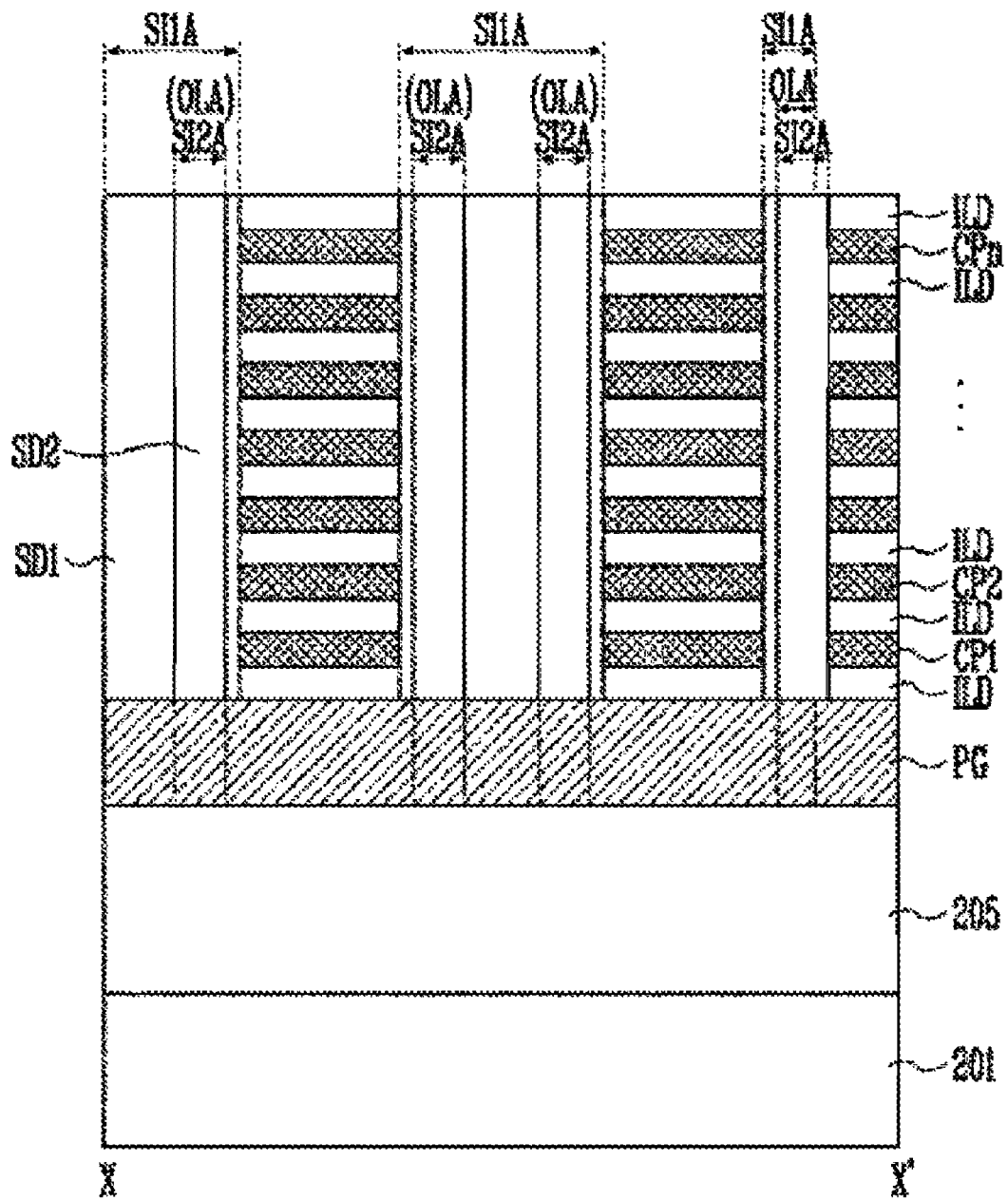
FIGS. 6A and 6B are sectional views illustrating an example of a semiconductor device according to an embodiment of the present disclosure.
Figure 6B:
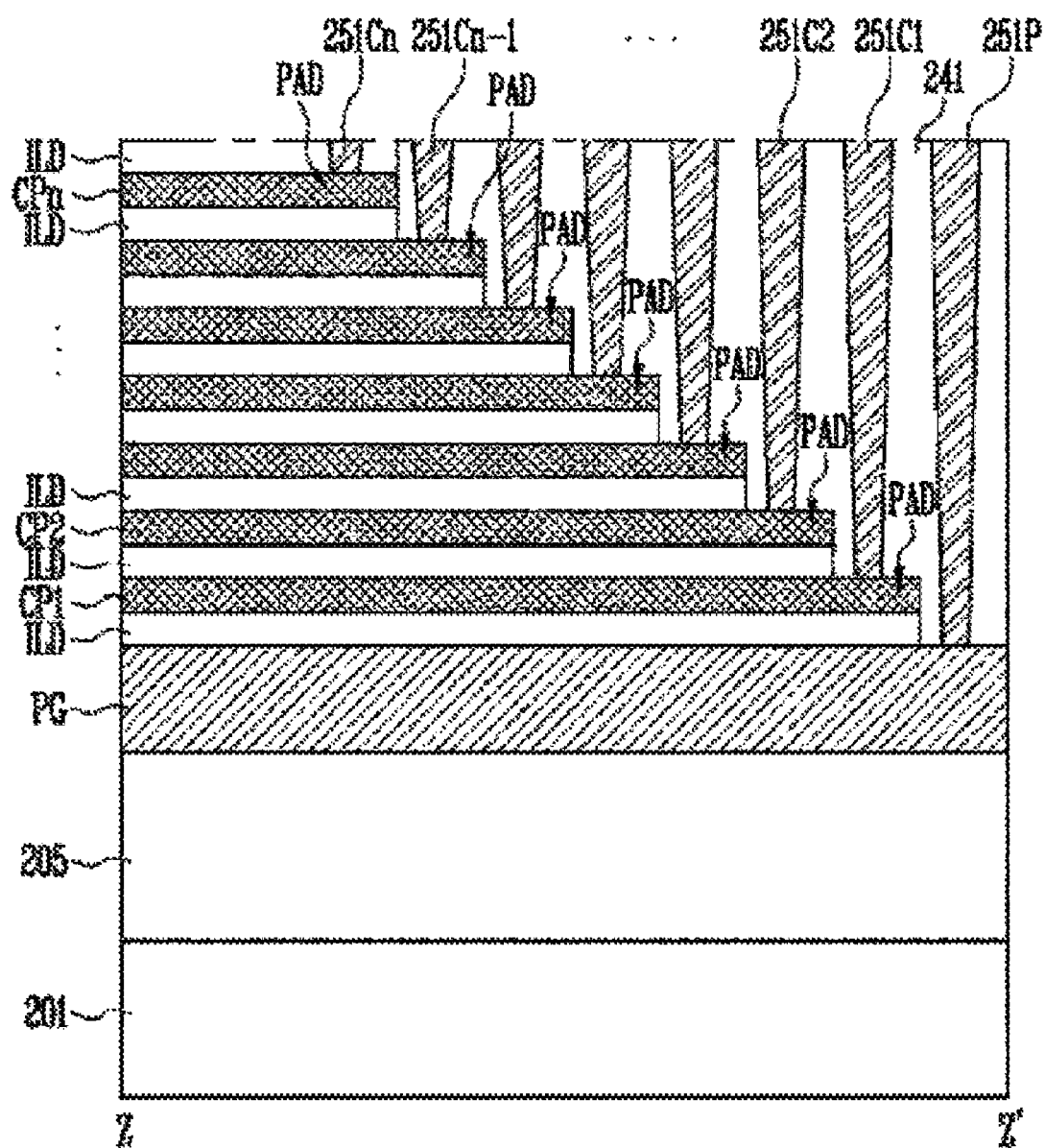

FIGS. 6A and 6B are sectional views illustrating an example of the semiconductor device according to an embodiment of the present disclosure. To be more specific, FIG. 6A is a sectional view taken along line X-X' of FIG. 2, and FIG. 6B is a sectional view taken along line Z-Z' of FIG. 5B. FIGS. 6A and 6B are sectional views taken along the trench.

Referring to FIGS. 6A and 6B, the trench of the substrate 201 may be filled with an isolation layer 205. The isolation layer 205 may be formed in a mesh type in the same manner as the trench 203 (FIG. 5A) to delimit the active regions 201A (FIG. 5A).

The pipe gate PG may be formed on the substrate 201 including the isolation layer 205 and the active regions 201A (FIG. 5A). The pipe gate PG may be placed between the substrate 201 and a stack structure of conductive patterns CP1 to CPn.

Interlayer insulation patterns ILD and the conductive patterns CP1 to CPn may be alternately stacked on the pipe gate PG. The interlayer insulation patterns ILD and the conductive patterns CP1 to CPn may be penetrated by the first and second slits SI1A and SI2A. The first and second slits SI1A and SI2A may be filled with first and second slit insulating layers SD1 and SD2, respectively. The first and second slits SI1A and SI2A illustrated in FIG. 6A are first types.

The first-type first slits SI1A and the first-type second slits SI2A may intersect with each other. Regions where the first-type first slits SI1A and the first-type second slits SI2A intersect with each other may be defined as overlapping regions OLA. At the overlapping region OLA, the second slit insulating layers SD2 may pass through the first slit insulating layers SD1.

As indicated by broken lines of FIG. 6A, due to the excessive etching process at the overlapping region OLA, each of the first-type second slits SI2A may partially pass through the pipe gate PG. According to an embodiment of the present disclosure, the trench filled with the isolation layer 205 may overlap the overlapping region OLA, thus preventing the first-type second slits SI2A from extending to the active region 201A (FIG. 5A) at the overlapping region OLA. Thus, even if a conductive material remains in a bottom of the first-type second slit SI2A of the overlapping region OLA, a probability of a bridge failure that the remaining conductive material connects the active region 201A (FIG. 5A) to the pipe gate PG may decrease.

In FIG. 6B, the pad patterns PAD of the conductive patterns CP1 to CPn may form a stepped structure. An end of the pipe gate PG may be exposed by the pad patterns PAD of the stepped structure. The pad patterns PAD and the end of the pipe gate PG may provide a region with which the contact plugs 251P and 251C1 to 251Cn is to come into contact. The pad patterns PAD and the pipe gate PG may be covered with a flattening insulating layer 241.

The contact plugs 251P and 251C1 to 251Cn may pass through the flattening insulating layer 241, and may be formed at different depths. The contact plugs 251P and 251C1 to 251Cn may include the pipe contact plug 251P and the gate contact plugs 251C1 to 251Cn. The pipe contact plug 251P may extend to come into contact with an upper surface of the pipe gate PG. The gate contact plugs 251C1 to 251Cn may extend to come into contact with pad patterns PAD, respectively. When the interlayer insulation patterns ILD extend to cover upper surfaces of the respective pad patterns PAD and the upper surface of the pipe gate PG, the contact plugs 251P and 251C1 to 251Cn may extend the interlayer insulation patterns ILD, respectively.

FIGS. 7A to 7F are sectional views illustrating an example method of manufacturing the semiconductor device illustrated in FIGS. 3A to 4B. FIGS. 7A to 7F are sectional views taken along line X-X' of FIG. 2 and line Y-Y' of FIG. 3B.

Figure 7A:
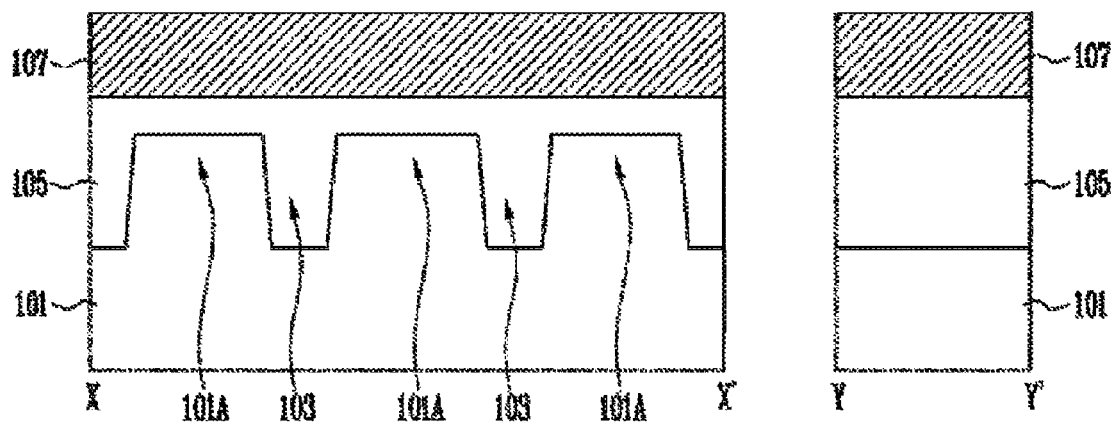

Referring to FIG. 7A, the substrate 101 may be etched to form the trench 103. The trench 103 may be formed in a mesh type as illustrated in FIG. 3A. The trench 103 delimits the active regions 101A of the substrate 101. Subsequently, the isolation layer 105 filling the trench 103 may be formed. The isolation layer 105 may be formed in a mesh type, as in the trench 103. The isolation layer 105 may be formed to cover the active regions 101A.

Thereafter, the pipe conductive layer 107 may be formed on the substrate 101 including the isolation layer 105 and the active regions 101A. The pipe conductive layer 107 may contain a polysilicon material. Although not illustrated, like the pipe channel layer P_CH of FIGS. 1 and 2, a pipe groove in which the pipe channel layer is to be placed may be formed in the pipe conductive layer 107, and then the pipe groove may be filled with a pipe sacrificial layer.

Figure 7B:
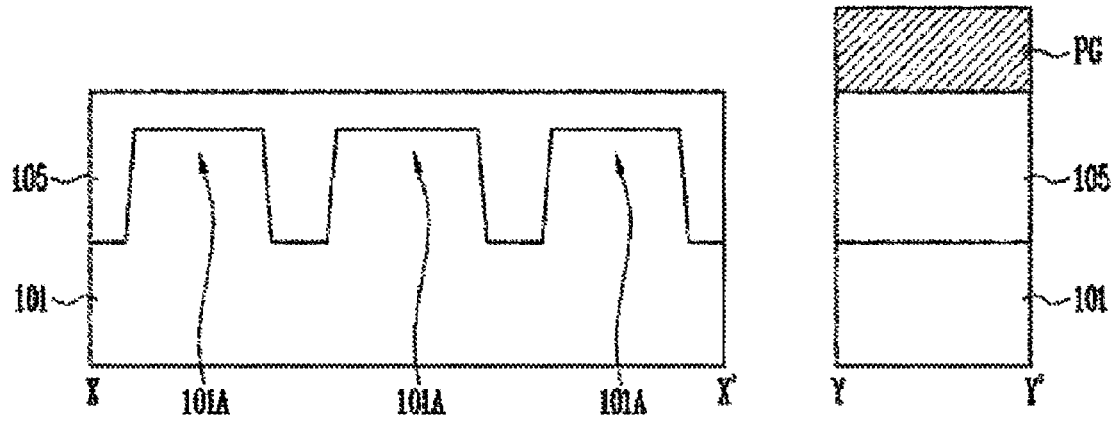

Referring to FIG. 7B, the pipe conductive layer 107 of FIG. 7a may be etched to form the pipe gate PG. Here, the pipe gate PG may be patterned not to overlap the third regions A3_S and A3_D illustrated in FIG. 3B.

Figure 7C:
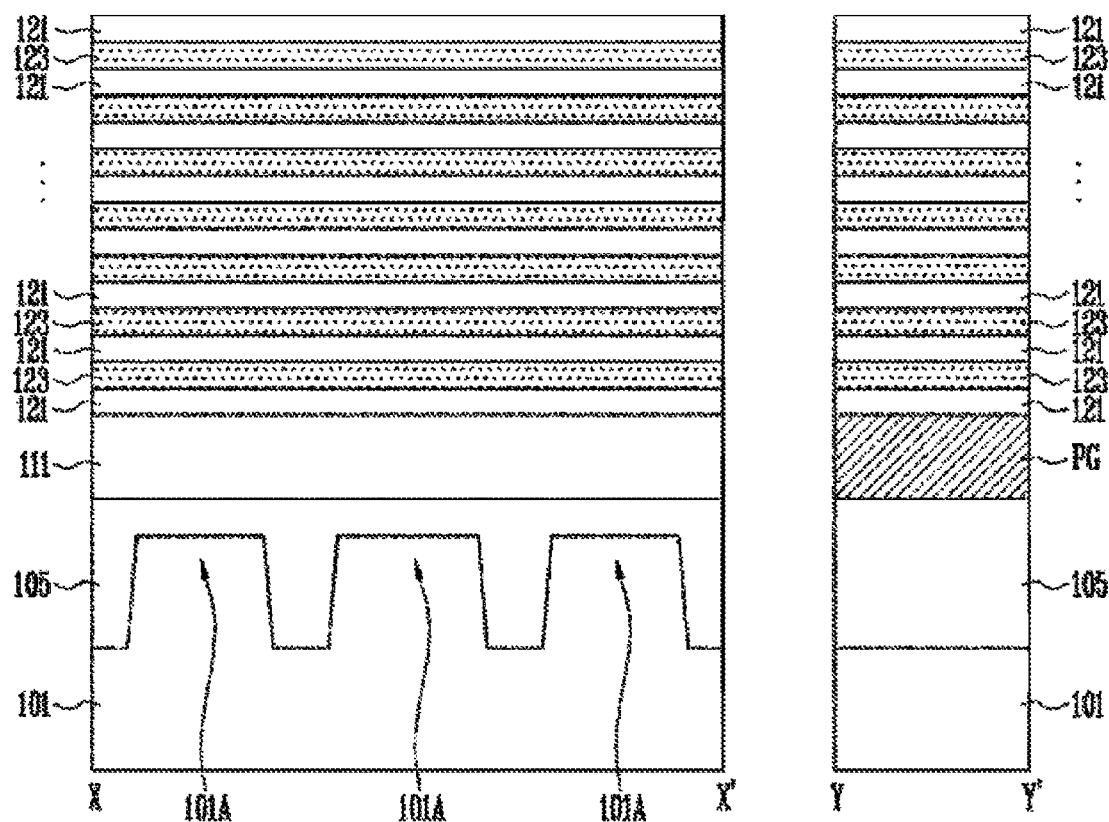

Referring to FIG. 7C, the first material layers 121 and the second material layers 123 may be alternately stacked on the pipe gate PG. The first material layers 121 may be a material for the interlayer insulation pattern. For example, the first material layers 121 may contain a silicon oxide material. The second material layers 123 may be made of a material different from that of the first material layers 121. For example, the second material layers 123 may be a sacrificial object having etching selectivity for the first material layers 121. For example, the second material layers 123 may contain a nitride material.

Figure 7D:
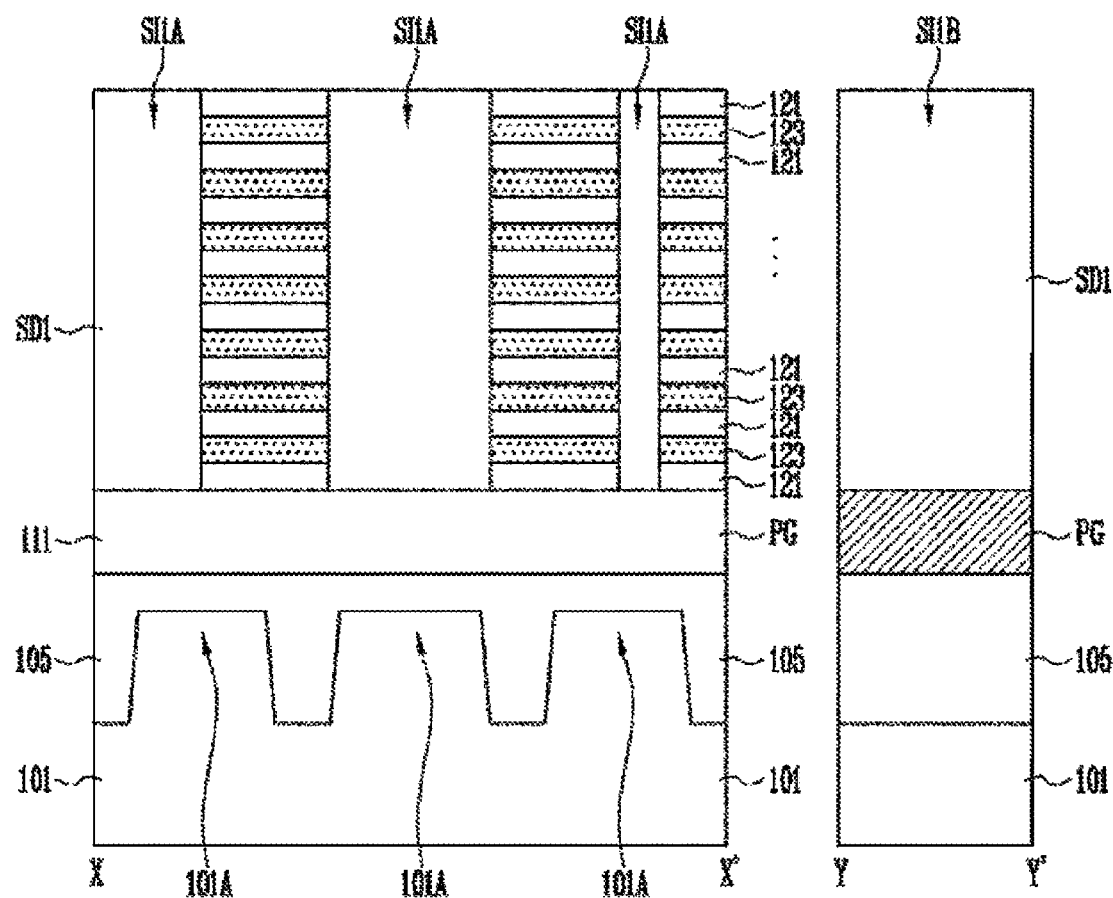

Referring to FIG. 7D, the first material layers 121 and the second material layers 123 may be etched to form the first slits SI1A and SI1B. The first slits SI1A and SI1B may be arranged in the same layout as the first slits SI1A and SI1B of FIG. 2.

Subsequently, the first slits SI1A and SI1B may be filled with the first slit insulating layers SD1. Although not illustrated, before the first slits SI1A and SI1B are formed or after the first slit insulating layers SD1 are formed, the first material layers 121 and the second material layers 123 may be patterned in the stepped structure SW of FIG. 3B. Although not illustrated, before the first slits SI1A and SI1B are formed or after the first slit insulating layers SD1 are formed, the first material layers 121 and the second material layers 123 may be etched to form holes in which the channel pillars D_CH and S_CH (e.g., the channel pillars D_CH and S_CH of FIGS. 1 and 2) are to be arranged. Subsequently, after the pipe sacrificial layer is removed via the holes, the channel layer CH (e.g., the channel layer CH of FIG. 1) may be formed in the holes and a region from which the pipe sacrificial layer is removed. Before the channel layer is formed, the multi layers may be formed.

Referring to FIG. 7E, the first material layers 121 of FIG. 7D and the second material layers 123 of FIG. 7D may be etched to form the second slits SI2A passing therethrough. The second slits SI2A of FIG. 7E may correspond to the first-type second slits SI2A of FIG. 2. In the process of forming the second slits SI2A, the first slit insulating layers SD1 corresponding to the overlapping regions OLA where the first slits SI1A (see FIG. 7D) intersect with the second slits SI2A may be penetrated by the second slits SI2A. Here, due to the excessive etching at the overlapping region OLA as indicated by broken lines, the second slits SI2A may extend into the pipe insulating layer 111. According to an embodiment of the present disclosure, since the pipe gate PG does not overlap the overlapping region OLA, the pipe gate PG is not affected by the excessive etching at the overlapping regions OLA.

The first material layers 121 of FIG. 7D may be separated into the interlayer insulation patterns ILD by the first slit insulating layers SD1 and the second slits SI2A.

Subsequently, the second material layers 123 of FIG. 7D may be selectively removed via the second slits SI2A, and region from which the second material layers 123 of FIG. 7D are removed may be filled with the conductive patterns CP1 to CPn. That is, the second material layers 123 of FIG. 7D are replaced by the conductive patterns CP1 to CPn through the second slits SI2A.

The conductive patterns CP1 to CPn may be formed in the following order. First, a conductive material may be formed fill the region from which the second material layers 123 of FIG. 7D are removed. Subsequently, the conductive material may be separated into the conductive patterns CP1 to CPn by removing the conductive material from the second slits SI2A. In the process of removing the conductive material from the interiors of the second slits SI2A, the conductive material may remain in bottoms of the second slits SI2A. According to an embodiment of the present disclosure, the pipe gate PG does not overlap lower portions of the overlapping regions OLA. Therefore, even if the second slits SI2A are formed near the active region 101A due to the excessive etching at the overlapping region OLA, a probability of a bridge failure that the conductive material remaining in the bottoms of the second slits SI2A at the overlapping region OLA connects the active region 101A to the pipe gate PG through may decrease.

Figure 7F:
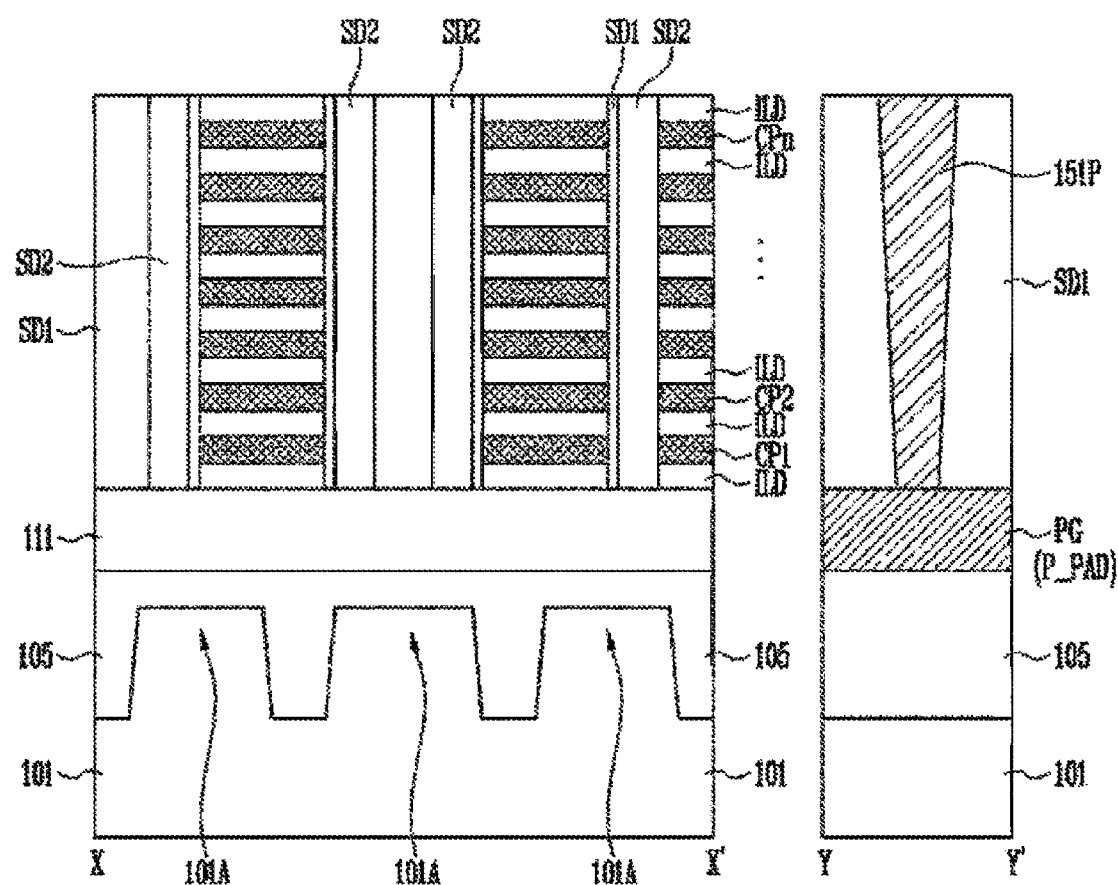

Referring to FIG. 7F, the second slits SI2A may be filled with second slit insulating layers SD2. Subsequently, a pipe contact plug 151P passing through the first slit insulating layer SD1 may be formed. The pipe contact plug 151P may pass through the first slit insulating layer SD1 and then extend to come into contact with the pipe pad pattern P_PAD.

Figure 8A:
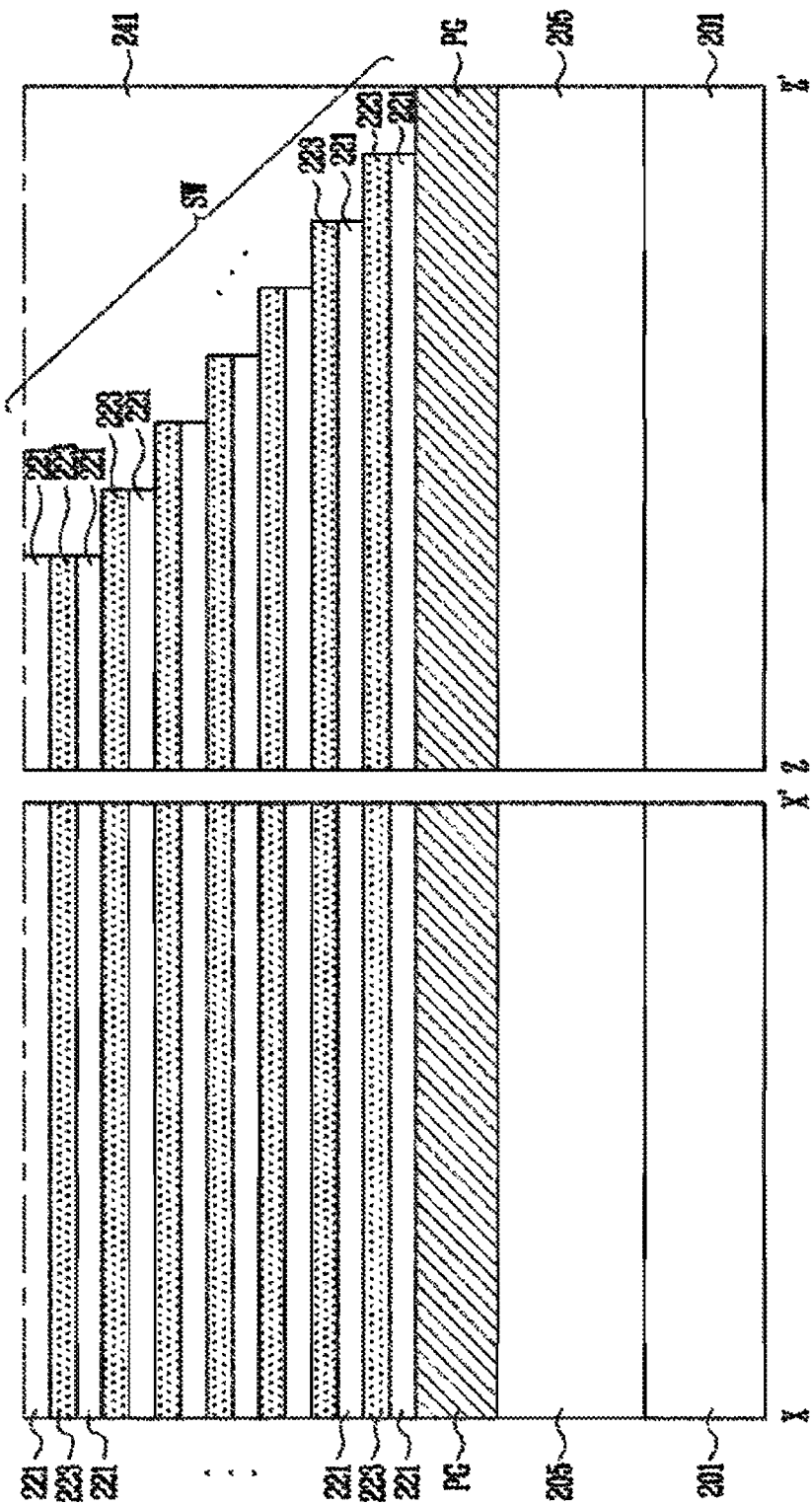
Figure 8C:
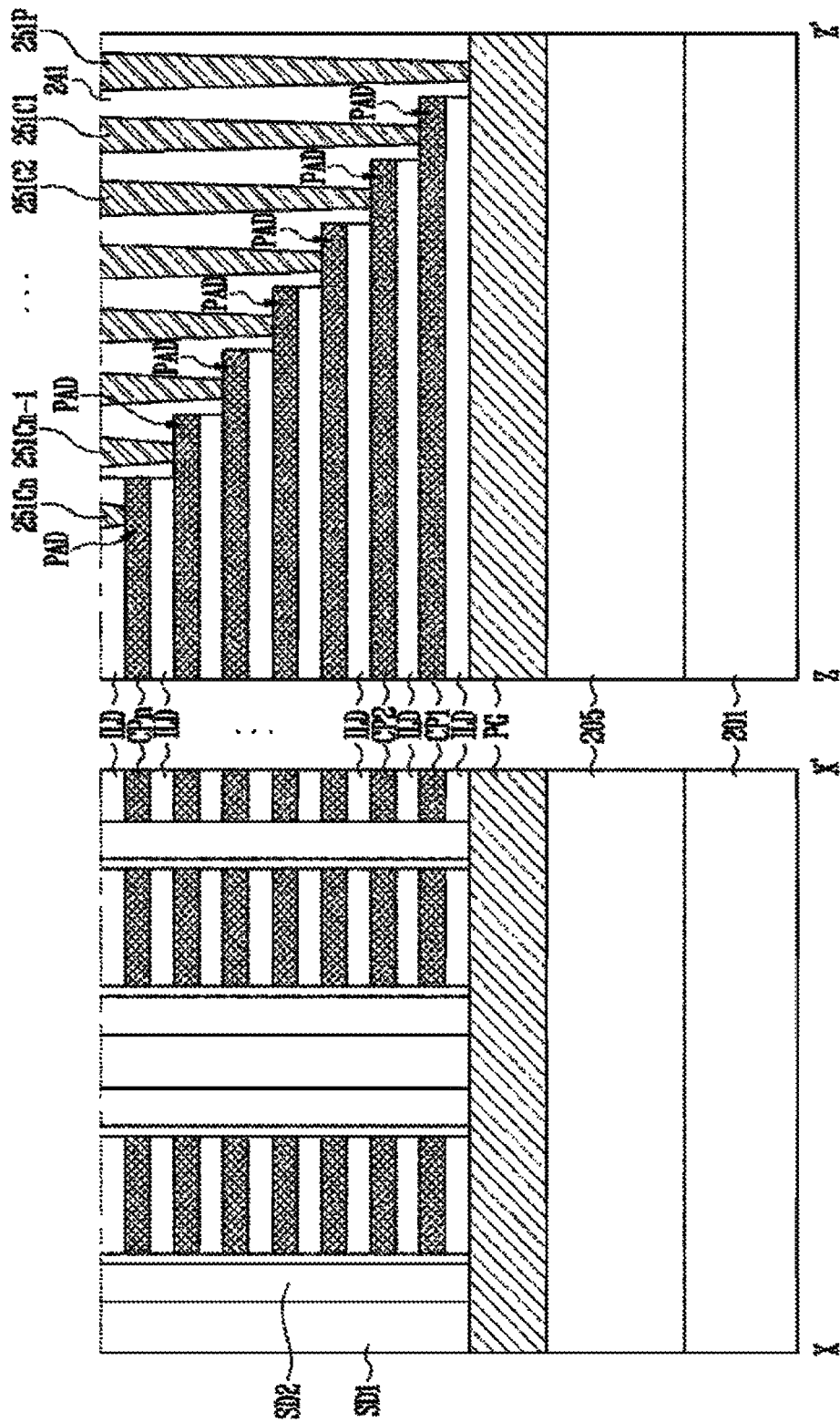

FIGS. 8A to 8C are sectional views illustrating an example method of manufacturing the semiconductor device illustrated in FIGS. 5A to 6B. FIGS. 8A to 8C are sectional views taken along line X-X' of FIG. 2 and line Y-Y' of FIG. 5B.

Referring to FIG. 8A, the substrate 201 may be etched to form the trench, and then the trench may be filled with the isolation layer 205. The trench and the isolation layer 205 may be formed in a mesh type as illustrated in FIG. 5A, and delimit the active regions 201A as illustrated in FIG. 5A.

Subsequently, the pipe conductive layer may be formed on the substrate 201 including the isolation layer 205 and the active regions 201A (e.g., the isolation layer 205 and the active regions 201A of FIG. 5A), and the pipe conductive layer may be etched to form the pipe gate PG. The pipe conductive layer may contain a polysilicon material. The pipe gate PG may be patterned as discussed with reference to FIG. 5B. Although not illustrated, the pipe groove in which the pipe channel layer P_CH (e.g., the pipe channel layer P_CH of FIGS. 1 and 2) is to be placed may be formed in the pipe gate PG, and the pipe groove may be filled with the pipe sacrificial layer.

Subsequently, the first material layers 221 and the second material layers 223 may be alternately stacked on the pipe gate PG. The first material layers 221 and the second material layers 223 may be formed of the same material as that of FIG. 7C.

Subsequently, the first material layers 221 and the second material layers 223 may be patterned in the form of the stepped structure SW. The stepped structure SW is formed to expose an end of the pipe gate PG. After the stepped structure SW is formed, the flattening insulating layer 241 may be formed to cover the stepped structure SW.

Although not illustrated, before or after the stepped structure SW is formed, the first material layers 221 and the second material layers 223 may be etched to form holes in which the channel pillars D_CH and S_CH (e.g., the channel pillars D_CH and S_CH of FIGS. 1 and 2) are to be placed. Subsequently, after the pipe sacrificial layer is removed through the holes, the channel layer CH (e.g., the channel layer CH of FIG. 1) may be formed in the holes and a region from which the pipe sacrificial layer is removed. Before the channel layer is formed, the multi layers may be formed.

Referring to FIG. 8B, the first material layers 221 of FIG. 8A and the second material layers 123 of FIG. 8A may be etched to form the first slits SI1A. The first slits SI2A of FIG. 8B may correspond to the first-type first slits SI1A of FIG. 2. Thereafter, the first slits SI1A may be filled with the first slit insulating layers SD1.

Subsequently, the first material layers 221 of FIG. 8A and the second material layers 223 of FIG. 8A may be etched to form the second slits SI2A passing therethrough. The second slits SI2A of FIG. 8B may correspond to the first-type second slits SI2A of FIG. 2. In the process of forming the second slits SI2A, the first slit insulating layers SD1 corresponding to the overlapping regions OLA at which the first slits SI1A intersect with the second slits SI2A may be penetrated by the second slits SI2A. Due to the excessive etching at the overlapping regions OLA as indicated by broken lines, a part of each of the second slits SI2A may extend into the pipe gate PG. According to an embodiment of the present disclosure, at the overlapping regions OLA, the active region 201A (e.g., the active region 201A of FIG. 5A) does not overlap the lower portion of the pipe gate PG, but the isolation layer 205 filling the trench overlaps the lower portion of the pipe gate PG. Therefore, at the overlapping regions OLA, the second slits SI2A may be arranged such that they are spaced apart from (e.g., the active region 201A of FIG. 5A) to ensure an insulation distance.

The first material layers 221 of FIG. 8A may be separated into interlayer insulation patterns ILD by first slit insulating layers SD1 and the second slits SI2A.

Subsequently, the second material layers 223 of FIG. 8A may be replaced by the conductive patterns CP1 to CPn through the second slits SI2A using the same process as that of FIG. 7E. The conductive material deposited in the process of forming the conductive patterns CP1 to CPn may remain in the bottoms of the second slits SI2A. According to an embodiment of the present disclosure, even if some of the second slits SI2A extend into the pipe gate PG due to the excessive etching at the overlapping region OLA, the isolation layer 205 placed under the overlapping region OLA may provide a sufficient spacing distance between the bottoms of each of the second slits SI2A at the overlapping region OLA and the active region 201A (see FIG. 5A) such that they are spaced far enough not to come into contact with one another. Therefore, an embodiment of the present disclosure may avoid a bridge failure that otherwise would have been caused by a possible bridge formation between the active region 201A (e.g. the active region 201A of FIG. 5A) and the pipe gate PG through the conductive material remaining in the bottom of the second slits SI2A at the overlapping region OLA.

Subsequently, the second slits SI2A may be filled with second slit insulating layers SD2.

Referring to FIG. 8C, contact plugs 251P, 251C1 to 251Cn may be formed to pass through the flattening insulating layer 241. When the interlayer insulation patterns ILD extend to cover the upper surface of each pad pattern PAD and the upper surface of the pipe gate PG, the contact plugs 251P, 251C1 to 251Cn may pass through the interlayer insulation patterns ILD, respectively.

In embodiments of the present disclosure, the trench filled with the isolation layer may be placed at the intersecting portions of the slits, thus reducing a probability of the malfunction of the semiconductor device that may be caused by the bridge failure.

Figure 9:
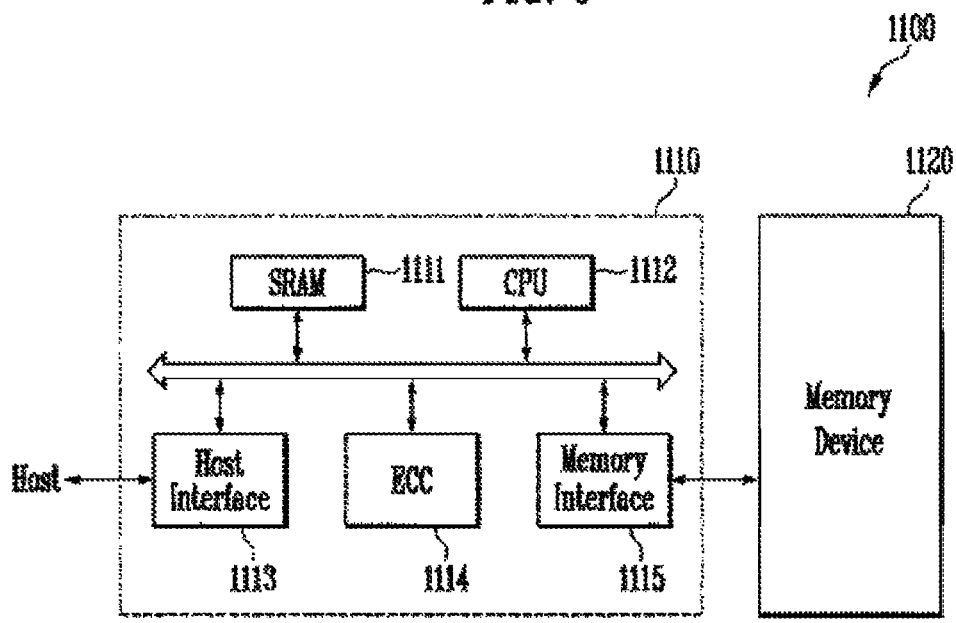
FIG. 9 is a diagram illustrating an example configuration of a memory system according to an embodiment of the present disclosure.

FIG. 9 is a diagram illustrating an example configuration of a memory system according to an embodiment of the present disclosure.

Referring to FIG. 9, the memory system 1100 according to an embodiment of the present disclosure may include a memory device 1120 and a memory controller 1110.

The memory device 1120 may include the structure illustrated in FIG. 2 and FIGS. 3A to 4B. In this case, the memory device 1120 may include a substrate, conductive patterns, and a pipe gate. The substrate may include first and second regions arranged in a first direction, and a third region arranged between the first and second regions. The conductive patterns may be stacked on the substrate to be spaced apart from each other, and may extend from the first region towards the second region. The pipe gate may be arranged between the conductive patterns and the substrate to overlap the first region, and may not overlap the third region.

The memory device 1120 may include the structure illustrated in FIG. 2 and FIGS. 5A to 6B. In this case, the memory device 1120 may include a substrate, conductive patterns, first and second slits, and a trench. The substrate may include first and second regions arranged in a first direction, and a third region arranged between the first and second regions. The conductive patterns may be stacked on the substrate to be spaced apart from each other, and may extend from the first region towards the second region. The first and second slits may pass through the conductive patterns, and may intersect with each other in the third region. The trench may be placed in the substrate to delimit the active regions, and may extend along the third region to overlap the intersecting portion of the first and second slits.

The memory device 1120 may be a multi-chip package having a plurality of flash memory chips.

The memory controller 1110 may control the memory device 1120, and may include an SRAM (Static Random Access Memory) 1111, a CPU 1112, a host interface 1113, an ECC (Error Correction Code) 1114, and a memory interface 1115. The SRAM 1111 may be used as an operation memory of the CPU 1112. The CPU 1112 may perform general control operations for data exchange of the memory controller 1110. The host interface 1113 may be provided with a data interchange protocol of a host coupled with the memory system 1100. Furthermore, the ECC 1114 may detect and correct an error included in the data read from the memory device 1120, and the memory interface 1115 may interface with the memory device 1120. In addition, the memory controller 1110 may further include a ROM (Read Only Memory) or the like that stores code data for interfacing with the host.

The above-described memory system 1100 may be a memory card or an SSD (Solid State Disk) equipped with the memory device 1120 and the controller 1110. For example, when the memory system 1100 is an SSD, the memory controller 1110 may communicate with an external device (e.g., host) via one of various interface protocols, such as an USB (Universal Serial Bus), an MMC (MultiMedia Card), a PCI-E (Peripheral Component Interconnection-Express), an SATA (Serial Advanced Technology Attachment), a PATA (Parallel Advanced Technology Attachment), an SCSI (Small Computer Small Interface), an ESDI (Enhanced Small Disk Interface), or an IDE (Integrated Drive Electronics).

Figure 10:
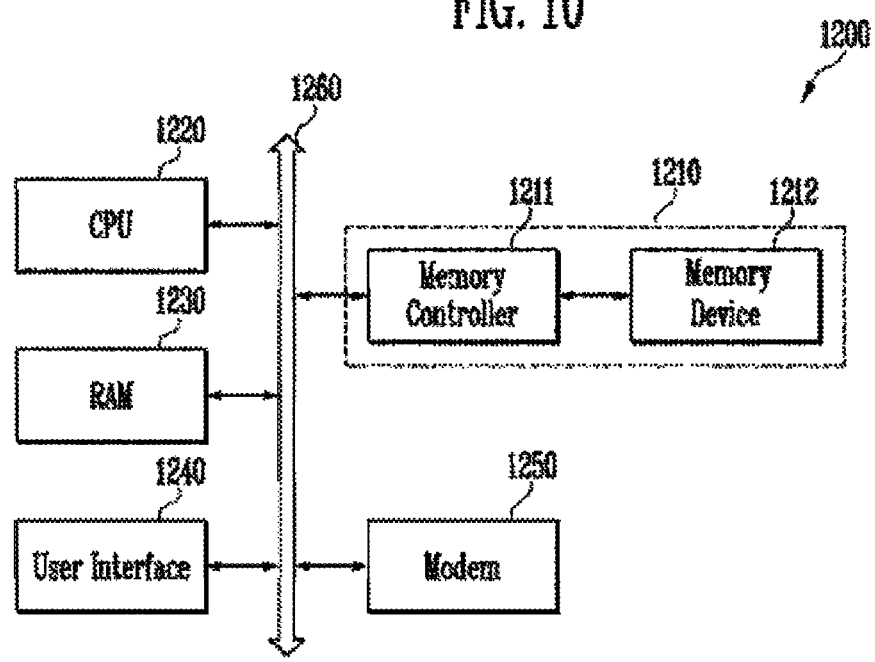
FIG. 10 is a diagram illustrating an example configuration of a computing system according to an embodiment of the present disclosure.

FIG. 10 is a diagram illustrating an example configuration of a computing system according to an embodiment of the present disclosure.

Referring to FIG. 10, the computing system 1200 according to an embodiment of the present disclosure may include a CPU 1220, an RAM (Random Access Memory) 1230, a user interface 1240, a modem 1250, and a memory system 1210, which are electrically coupled to a system bus 1260. Further, if the computing system 1200 is a mobile device, it may further include a battery for supplying operating voltage to the computing system 1200. An application chip set, a camera image processor CIS, a mobile DRAM and the like may be further included.

As described above with reference to FIG. 9, the memory system 1210 may be configured by the memory device 1212 and the memory controller 1211.

Example embodiments have been disclosed herein, and although specific terms are employed, they are used and are to be interpreted in a generic and descriptive sense only and not for purpose of limitation. Further, it will be understood by those of skill in the art that various changes in form and details may be made without departing from the spirit and scope of the present invention as set forth in the following claims.

What is claimed is:

1. A semiconductor device comprising:
   a substrate including first and second regions arranged in a first direction, and a third region arranged between the first and second regions;
   conductive patterns stacked on the substrate to be spaced apart from each other and extending from the first region to the second region; and
   a pipe gate arranged between the conductive patterns and the substrate to overlap the first region, the pipe gate being not overlapped with the third region,
   wherein the conductive patterns are overlapped with the third region.

2. The semiconductor device according to claim 1, further comprising:
   a first-type first slit placed on the third region to pass through the conductive patterns; and
   a second slit extending from the first region to the third region, intersecting with the first-type first slit in the third region, and passing through the conductive patterns.

3. The semiconductor device according to claim 2, wherein the pipe gate is not overlapped with an intersecting portion of the first-type first slit and the second slit.

4. The semiconductor device according to claim 1, wherein the pipe gate includes a pipe pad pattern that protrudes laterally and is placed on the first region.

5. The semiconductor device according to claim 4, further comprising:
   a second-type first slit extending in the first direction to overlap the pipe pad pattern and passing through the conductive patterns;
   a first slit insulating layer placed in the second-type first slit; and
   a pipe contact plug passing through the first slit insulating layer to come into contact with the pipe pad pattern.

6. The semiconductor device according to claim 5, further comprising:
   a trench placed in the substrate to delimit active regions and overlapping with the pipe pad pattern and the pipe contact plug; and
   an isolation layer filling the trench.

7. The semiconductor device according to claim 6, wherein the trench is formed in a mesh type.

8. The semiconductor device according to claim 1, wherein the conductive patterns include pad patterns forming a stepped structure on the second region.

9. The semiconductor device according to claim 1, wherein the pipe gate is not overlapped with the second region.

10. The semiconductor device according to claim 1, further comprising:

a source-side channel pillar passing through the conductive patterns;

a drain-side channel pillar passing through the conductive patterns; and a pipe channel layer embedded in the pipe gate to couple the source-side channel pillar with the drain-side channel pillar.

11. A semiconductor device comprising:

a substrate including first and second regions arranged in a first direction, and a third region arranged between the first and second regions;

conductive patterns stacked on the substrate to be spaced apart from each other and extending from the first region to the second region;

a first slit and a second slit passing through the conductive patterns and intersecting with each other in the third region; and a trench placed in the substrate to delimit the active regions and extending along the third region to overlap an intersecting portion of the first slit and the second slit.

12. The semiconductor device according to claim 11, wherein the trench extends to the first region and the second region to be formed in a mesh type and delimits the active regions in the first region and the second region, respectively.

13. The semiconductor device according to claim 11, wherein a pattern density of the active regions per unit area is more uniform at an area far from the third region than at an area near the third region.

14. The semiconductor device according to claim 11, wherein edge regions of the active regions close to the third region are formed to be wider than remaining regions.

15. The semiconductor device according to claim 11, further comprising:

a pipe gate placed between the substrate and the conductive patterns and extending from the first region to the second region.

16. The semiconductor device according to claim 15, wherein the conductive patterns include pad patterns that form a stepped structure on the second region and expose an end of the pipe gate.

17. The semiconductor device according to claim 15, further comprising:

a source-side channel pillar passing through the conductive patterns;

a drain-side channel pillar passing through the conductive patterns; and a pipe channel layer embedded in the pipe gate to couple the source-side channel pillar to the drain-side channel pillar.

\* \* \* \* \*